(12) United States Patent
Ching et al.

(10) Patent No.: US 9,577,101 B2
(45) Date of Patent: Feb. 21, 2017

(54) SOURCE/DRAIN REGIONS FOR FIN FIELD EFFECT TRANSISTORS AND METHODS OF FORMING SAME

(71) Applicant: Taiwan Semiconductor Manufacturing Company, Ltd., Hsin-Chu (TW)

(72) Inventors: Kuo-Cheng Ching, Zhubei (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/657,312

(22) Filed: Mar. 13, 2015

(65) Prior Publication Data

US 2016/0268434 A1    Sep. 15, 2016

(51) Int. Cl.
| | |
|---|---|
| H01L 29/78 | (2006.01) |
| H01L 21/8234 | (2006.01) |
| H01L 29/66 | (2006.01) |
| H01L 27/092 | (2006.01) |
| H01L 29/06 | (2006.01) |
| H01L 29/08 | (2006.01) |
| H01L 21/8238 | (2006.01) |

(52) U.S. Cl.
CPC .. *H01L 29/7851* (2013.01); *H01L 21/823431* (2013.01); *H01L 21/823814* (2013.01); *H01L 21/823821* (2013.01); *H01L 29/0653* (2013.01); *H01L 29/0847* (2013.01); *H01L 29/6656* (2013.01); *H01L 29/66636* (2013.01); *H01L 29/66795* (2013.01)

(58) Field of Classification Search
CPC ............. H01L 29/7851; H01L 29/6656; H01L 29/0653; H01L 29/66795; H01L 29/66636; H01L 29/0847; H01L 21/823431; H01L 21/823821; H01L 21/823814; H01L 27/0924
USPC ........ 438/283, 294, 268, 157; 257/401, 288, 257/368, 351, 192, E29.262, E29.274, 257/E29.022, E21.014, E21.629
See application file for complete search history.

(56) References Cited

U.S. PATENT DOCUMENTS

| | | |
|---|---|---|
| 6,611,029 B1 | 8/2003 | Ahmed et al. |
| 6,800,910 B2 | 10/2004 | Lin et al. |
| 6,882,025 B2 | 4/2005 | Yeo et al. |
| 7,485,520 B2 | 2/2009 | Zhu et al. |
| 7,564,081 B2 | 7/2009 | Zhu et al. |
| 8,487,378 B2 | 7/2013 | Goto et al. |
| 8,729,634 B2 | 5/2014 | Shen et al. |
| 8,826,213 B1 | 9/2014 | Ho et al. |

(Continued)

FOREIGN PATENT DOCUMENTS

KR    20090017041 A    2/2009

*Primary Examiner* — Dao H Nguyen
(74) *Attorney, Agent, or Firm* — Slater Matsil, LLP

(57) ABSTRACT

A method for forming a semiconductor device includes forming a fin extending upwards from a semiconductor substrate and forming a sacrificial layer on sidewalls of a portion of the fin. The method further includes forming a spacer layer over the sacrificial layer and recessing the portion of the fin past a bottom surface of the sacrificial layer. The recessing forms a trench disposed between sidewall portions of the spacer layer. At least a portion of the sacrificial layer is removed, and a source/drain region is formed in the trench.

20 Claims, 25 Drawing Sheets

(56) References Cited

U.S. PATENT DOCUMENTS

| | | | |
|---|---|---|---|
| 8,887,106 B2 | 11/2014 | Ho et al. | |
| 9,306,067 B2* | 4/2016 | Ching | H01L 29/1054 |
| 2009/0045450 A1 | 2/2009 | Koo et al. | |
| 2014/0282326 A1 | 9/2014 | Chen et al. | |
| 2015/0380556 A1* | 12/2015 | Ching | H01L 29/7849 |
| | | | 257/351 |
| 2016/0005656 A1* | 1/2016 | Ching | H01L 21/82382 |
| | | | 438/283 |
| 2016/0043082 A1* | 2/2016 | Greene | H01L 27/0886 |
| | | | 257/401 |
| 2016/0079427 A1* | 3/2016 | Ching | H01L 29/785 |
| | | | 438/151 |
| 2016/0093726 A1* | 3/2016 | Ching | H01L 29/785 |
| | | | 257/192 |
| 2016/0099352 A1* | 4/2016 | Lee | H01L 29/7851 |
| | | | 257/192 |

\* cited by examiner

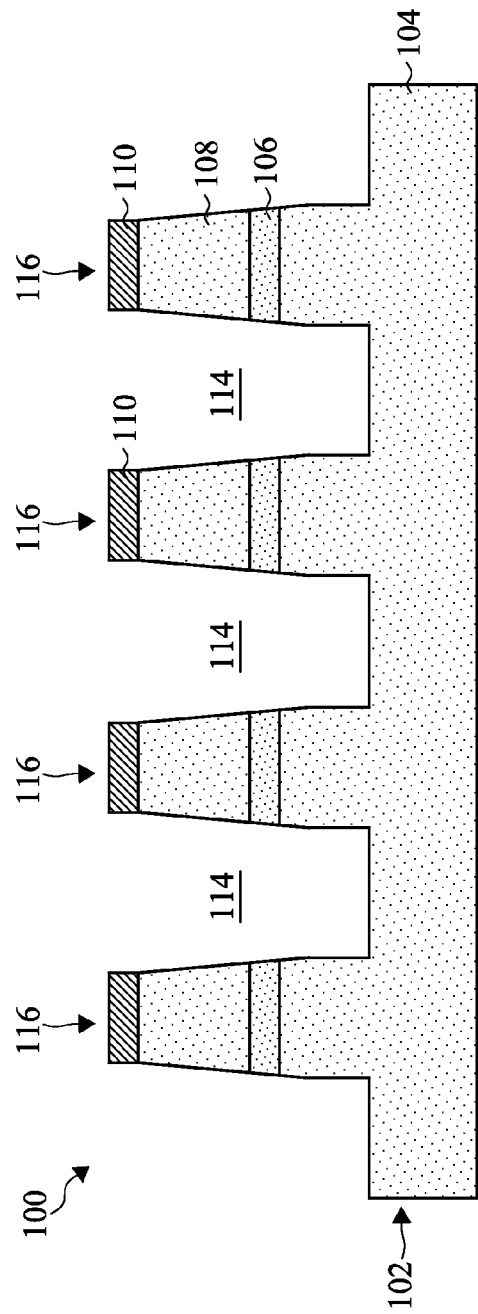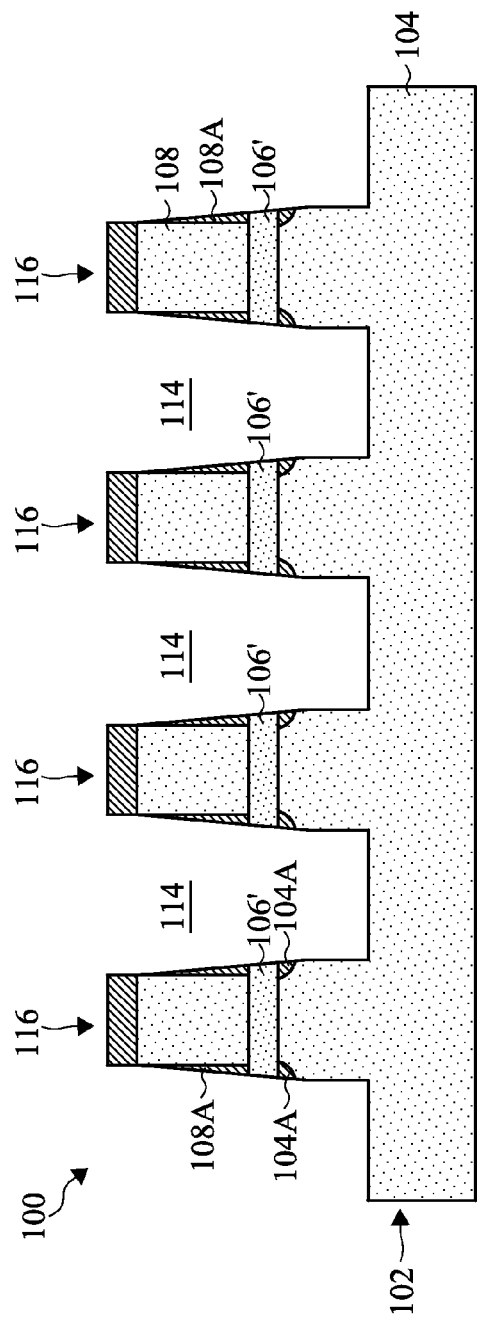
Fig. 4
Fig. 5

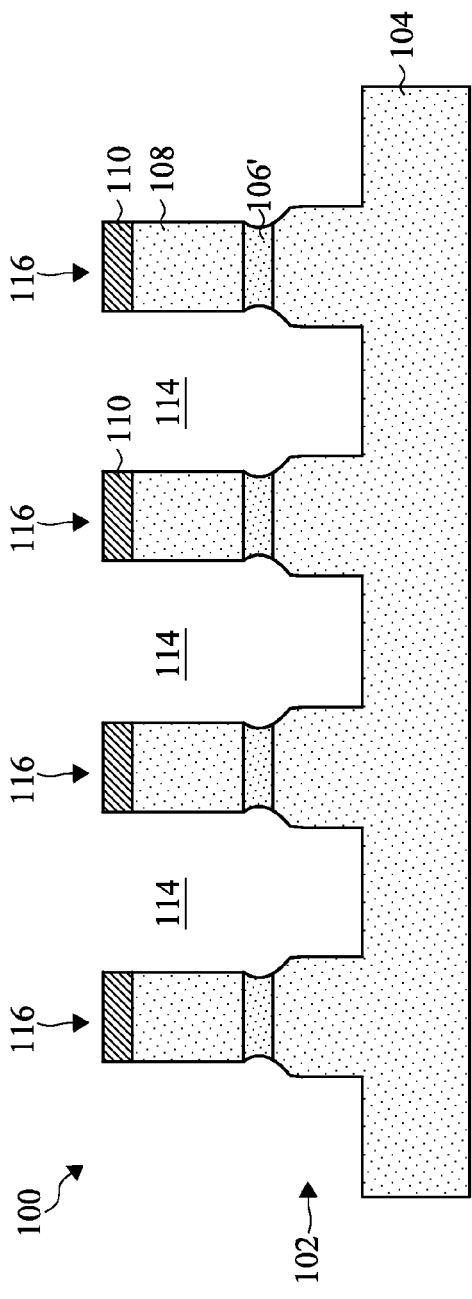
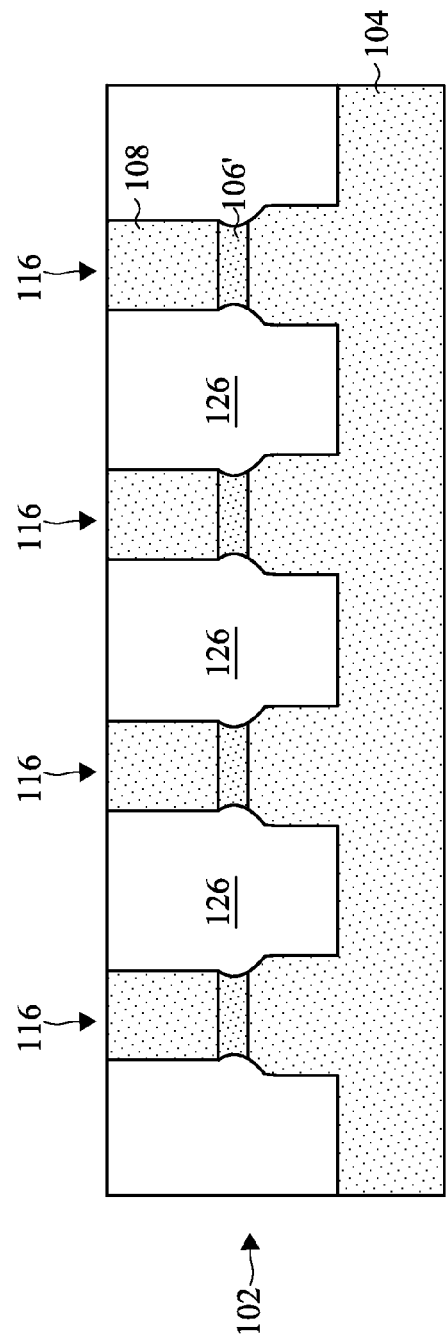

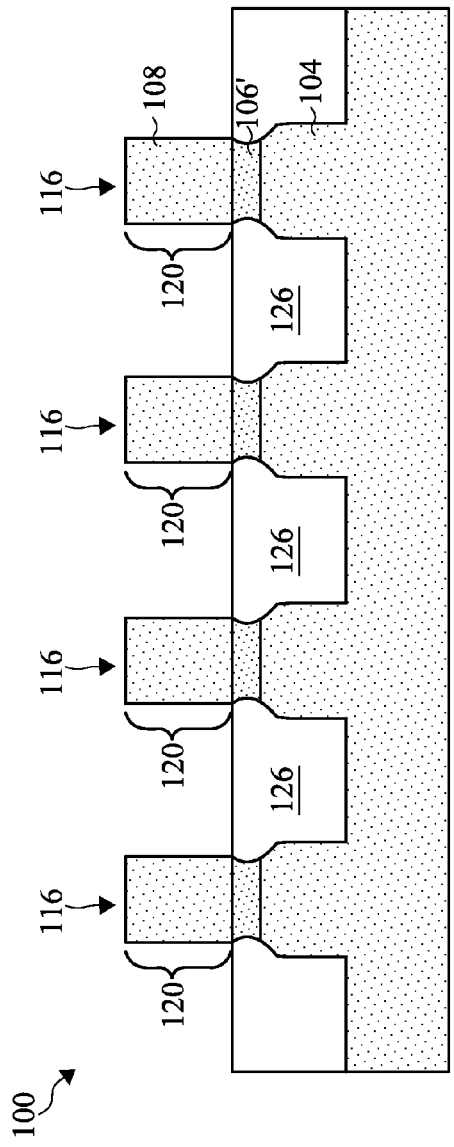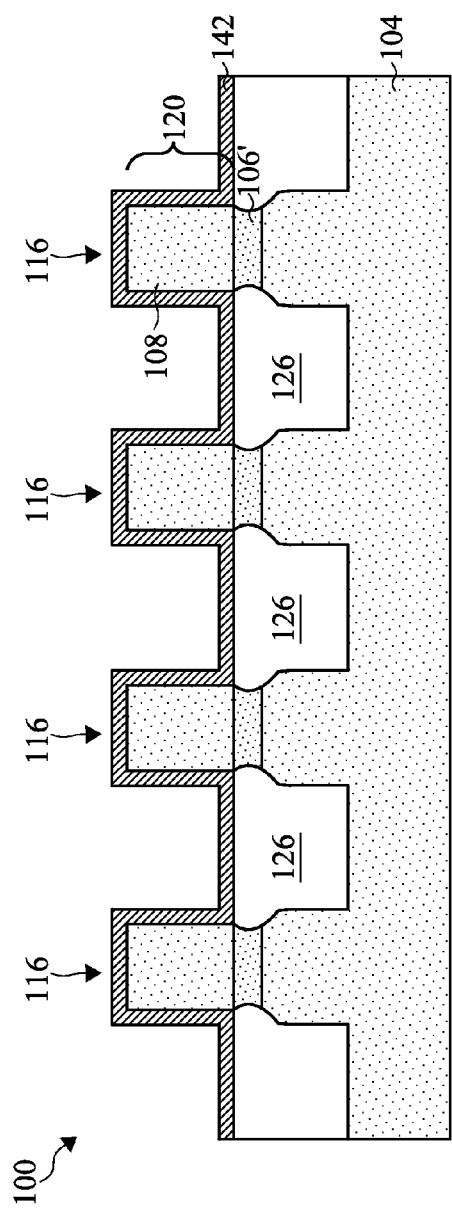
Fig. 8
Fig. 9

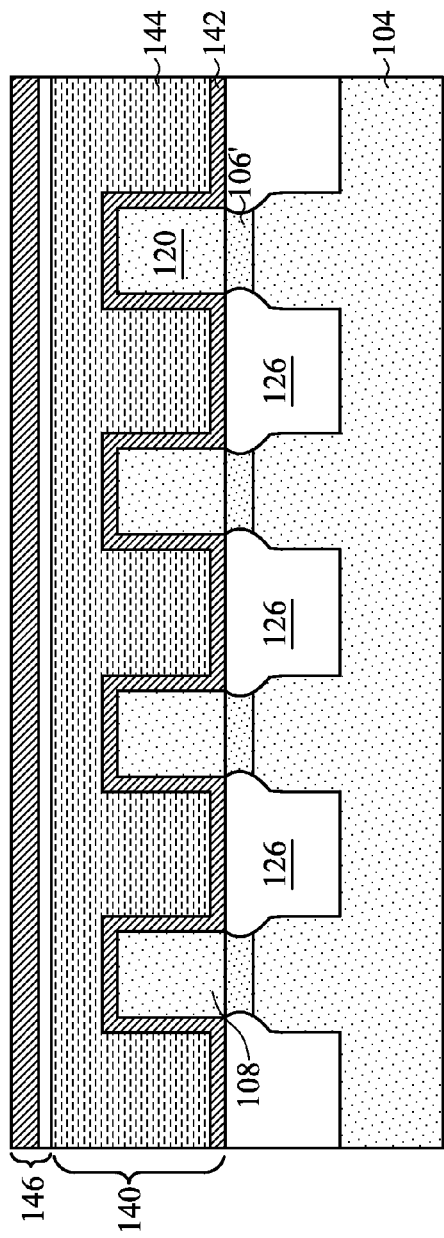
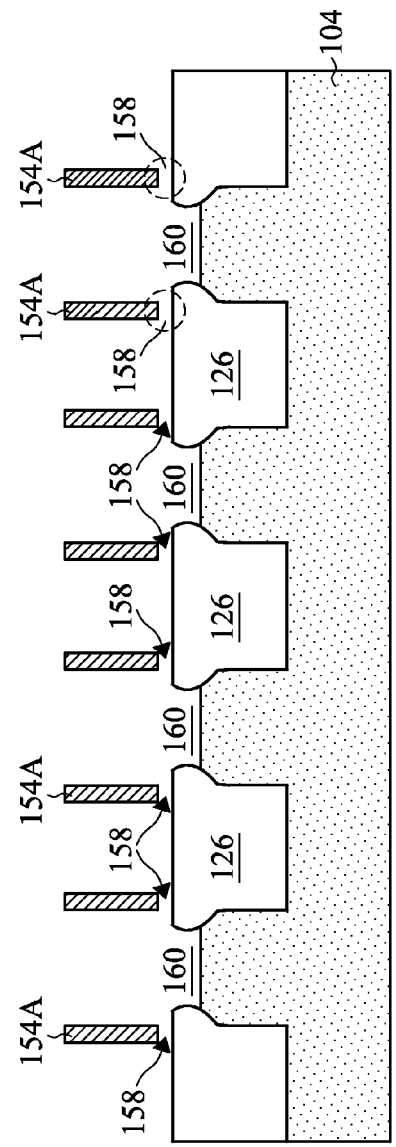
Fig. 13A
Fig. 13B

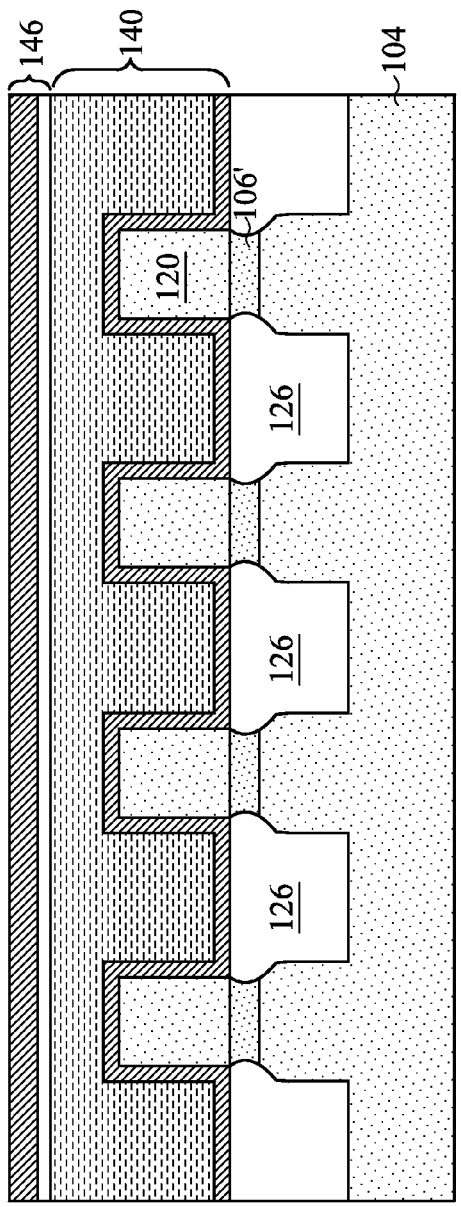
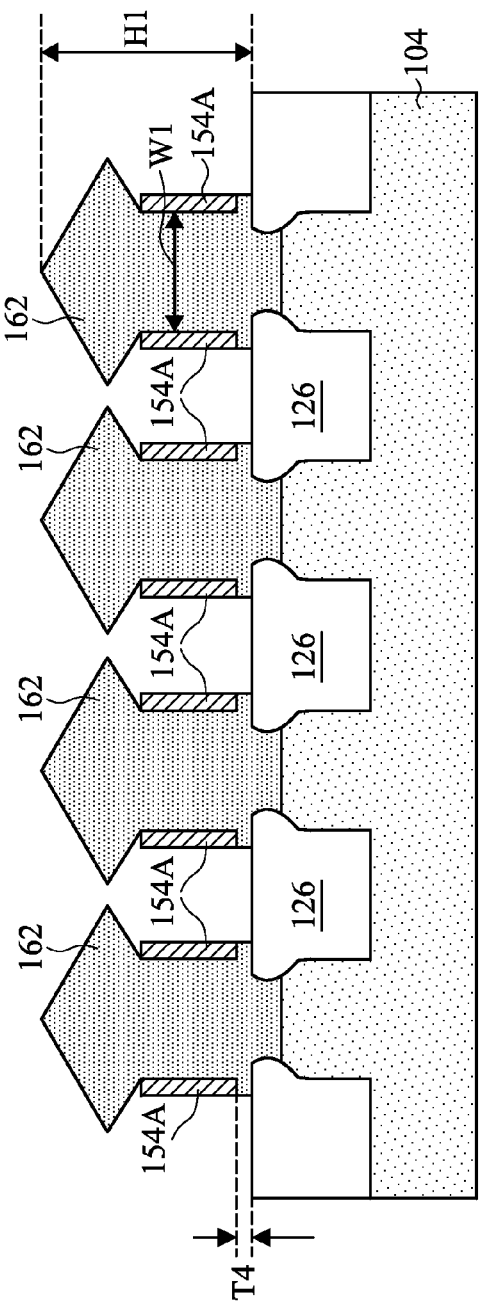
Fig. 14A
Fig. 14B

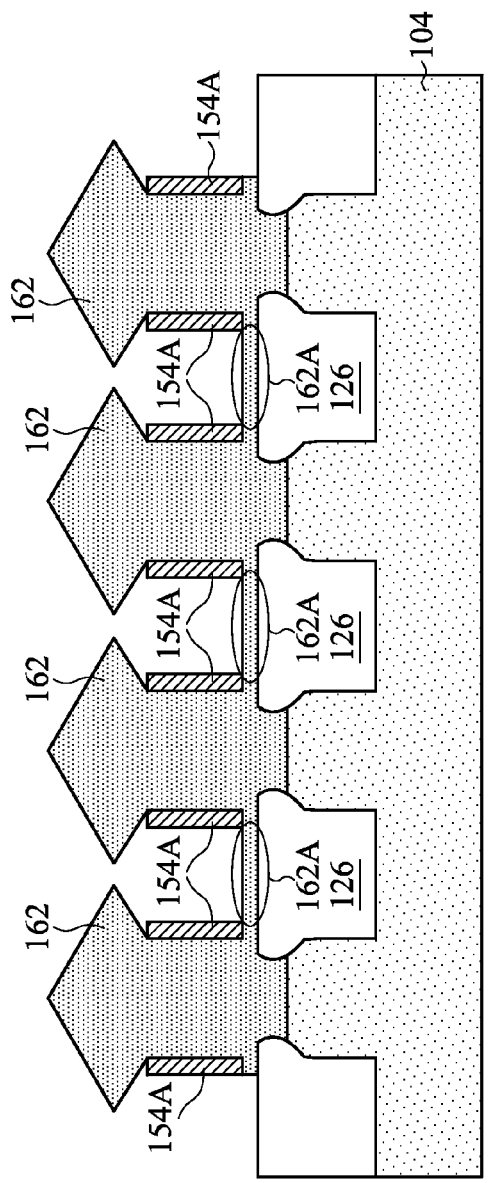
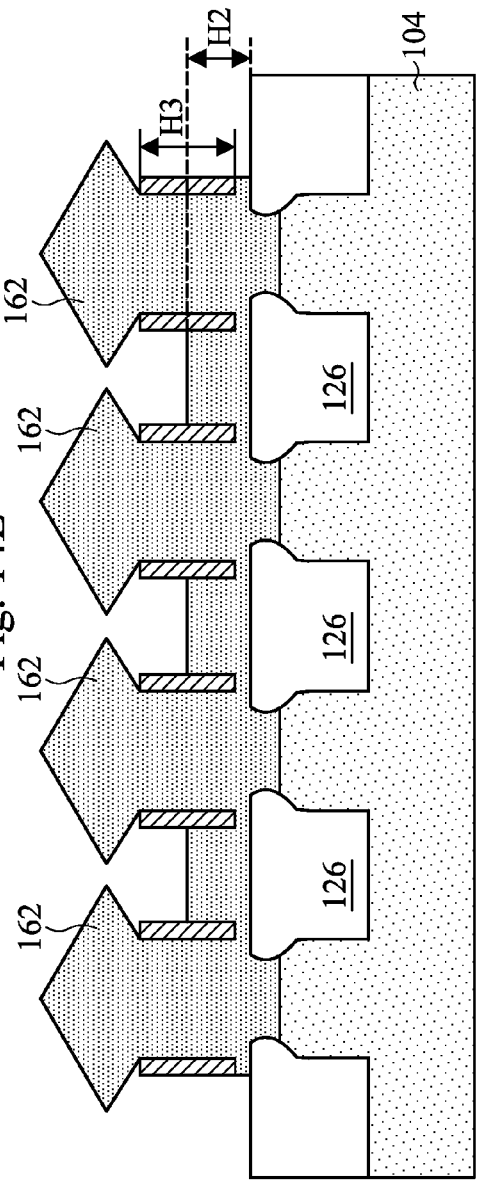
Fig. 14E
Fig. 14F

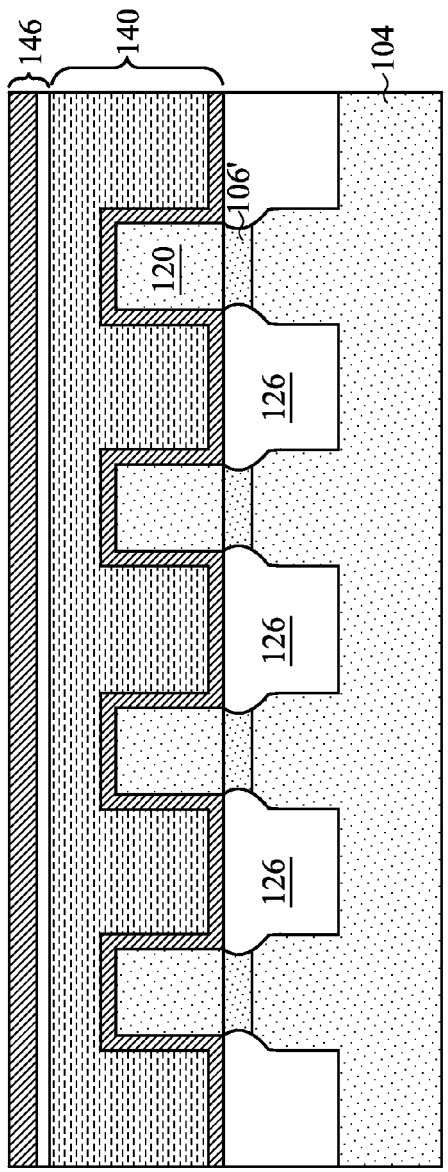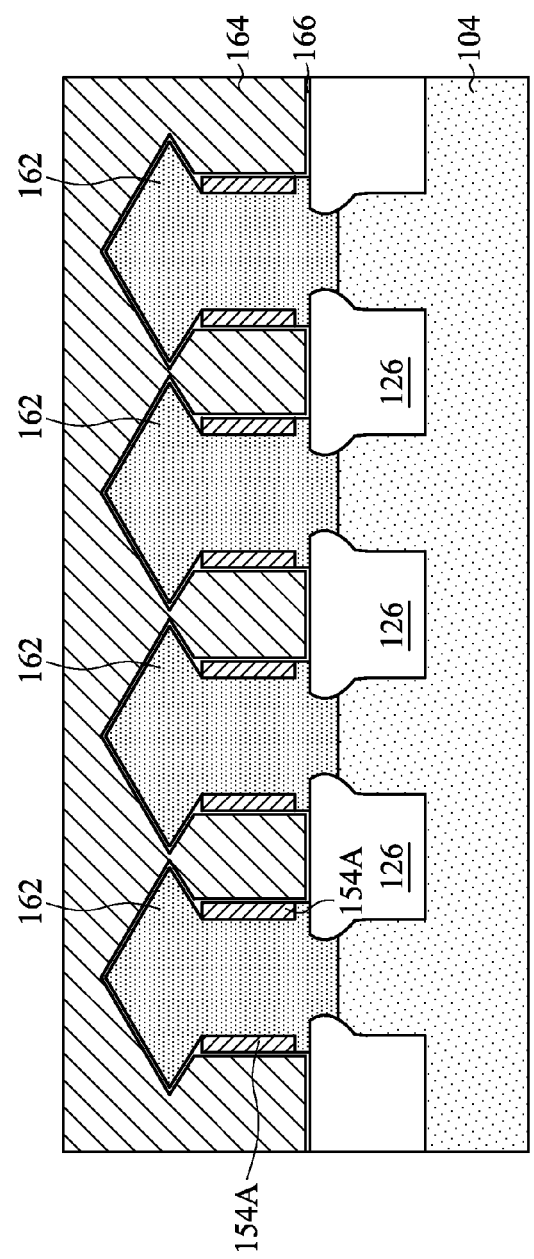
Fig. 15A
Fig. 15B

SOURCE/DRAIN REGIONS FOR FIN FIELD EFFECT TRANSISTORS AND METHODS OF FORMING SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

In a typical finFET, a vertical fin structure is formed over a substrate. This vertical fin structure is used to form source/drain regions in the lateral direction and a channel region in the fin. A gate is formed over the channel region of the fin in the vertical direction forming a finFET. Subsequently, an inter-layer dielectric (ILD) and a plurality of interconnect layers may be formed over the finFET.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2 through 17C illustrate cross-sectional and three-dimensional views of intermediary stages of the manufacturing a finFET in accordance with some embodiments.

DETAILED DESCRIPTION

Figure 1:
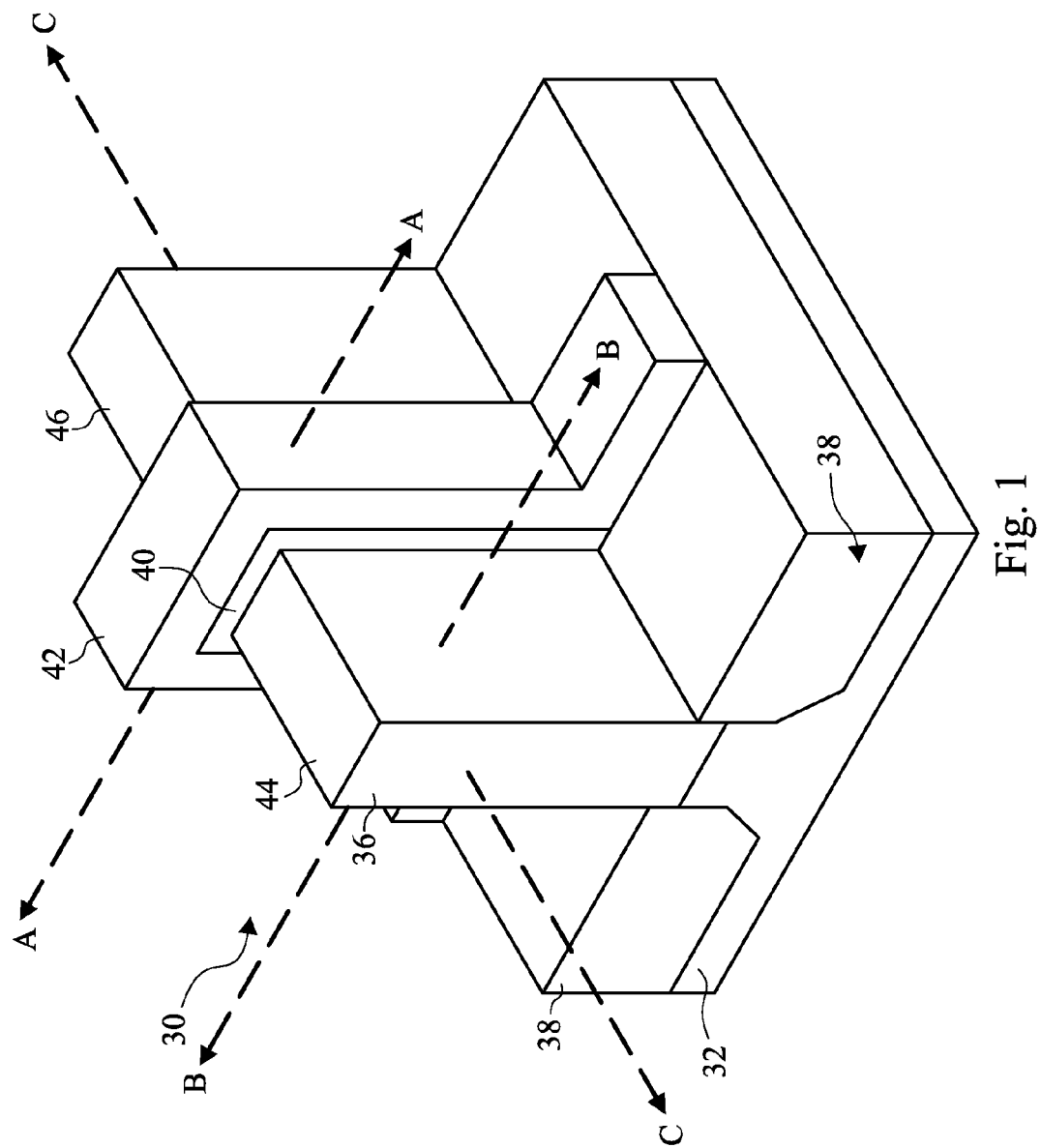
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include the formation of a sacrificial layer on a fin for improved source/drain epitaxy. With the downsizing of finFET devices, devices having relatively high aspect ratio fins are used for improved drive current. Furthermore, sidewall spacers are formed on fins to define source/drain epitaxy regions and to reduce source/drain epitaxy shorting for dense device regions. However, the high aspect ratio of such fins (compounded by the presence of sidewall spacers) may cause the formation of undesirable voids during source/drain epitaxy, particularly in bottom portions of the source/drain regions.

In various embodiments, a sacrificial layer may be formed on a fin prior to the formation of source/drain sidewall spacers. Subsequently, sidewall spacers are formed on the sacrificial layer. Notably, the sacrificial layer may be disposed between a bottom of the sidewall spacer and the underlying device features (e.g., STI regions and/or a substrate from which the fin extends). Portions of the fin between the sidewall spacers are recessed, and the sacrificial layer is removed. An epitaxial process may be performed to grow source/drain regions between the sidewall spacers. Because the sacrificial layer is formed between the sidewall spacers and the underlying device features, openings are formed under the sidewall spacers after the sacrificial layer is removed. During epitaxy, a precursor may flow from both a top area and a bottom area (e.g., through the openings) of adjacent sidewall spacers. Thus, source/drain regions may be grown multi-directionally between sidewall spacers, which advantageously decreases the risk of forming voids. In the resulting structure, a portion of the source/drain region may be disposed under the sidewall spacers.

FIG. 1 illustrates an example of a finFET 30 in a three-dimensional view. FinFET 30 includes a fin 36 on a substrate 32. Substrate 32 includes isolation regions 38, and fin 36 protrudes above and from between neighboring isolation regions 38. A gate dielectric 40 is along sidewalls and over a top surface of fin 36, and a gate electrode 42 is over gate dielectric 40. Portions of fin 36 covered by gate dielectric 38/gate electrode 42 may be referred to as a channel region of finFET 30. Source/drain regions 44 and 46 are disposed in opposite sides of fin 36 with respect to the gate dielectric 40 and gate electrode 42. FIG. 1 further illustrates reference cross-sections that are used in later figures. Cross-section A-A is across a channel, gate dielectric 40, and gate electrode 42 of finFET 30. Cross-section B-B is across a source/drain region 44 or 46 of the finFET 30. Cross-section C-C is perpendicular to cross-section A-A and is along a longitudinal axis of fin 36 and in a direction of, for example, a current flow between the source/drain regions 44 and 46. Subsequent figures refer to these reference cross-sections for clarity.

Figure 17A:
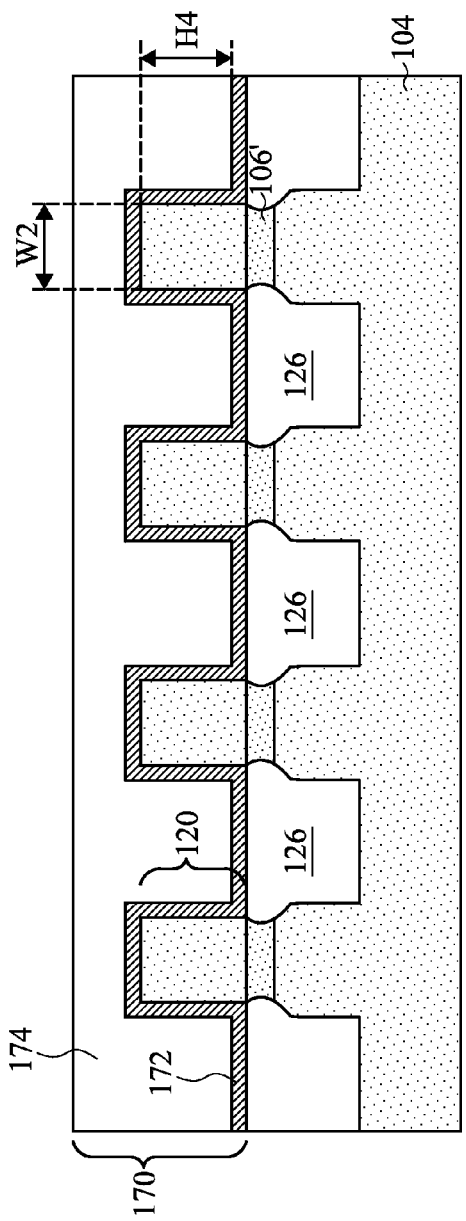
Figure 17B:
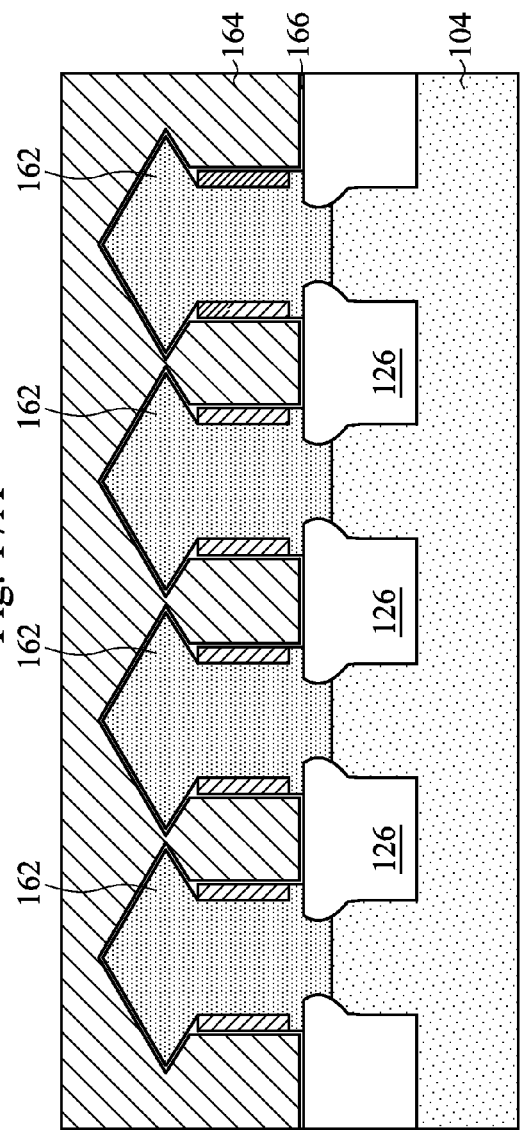
Figure 17C:
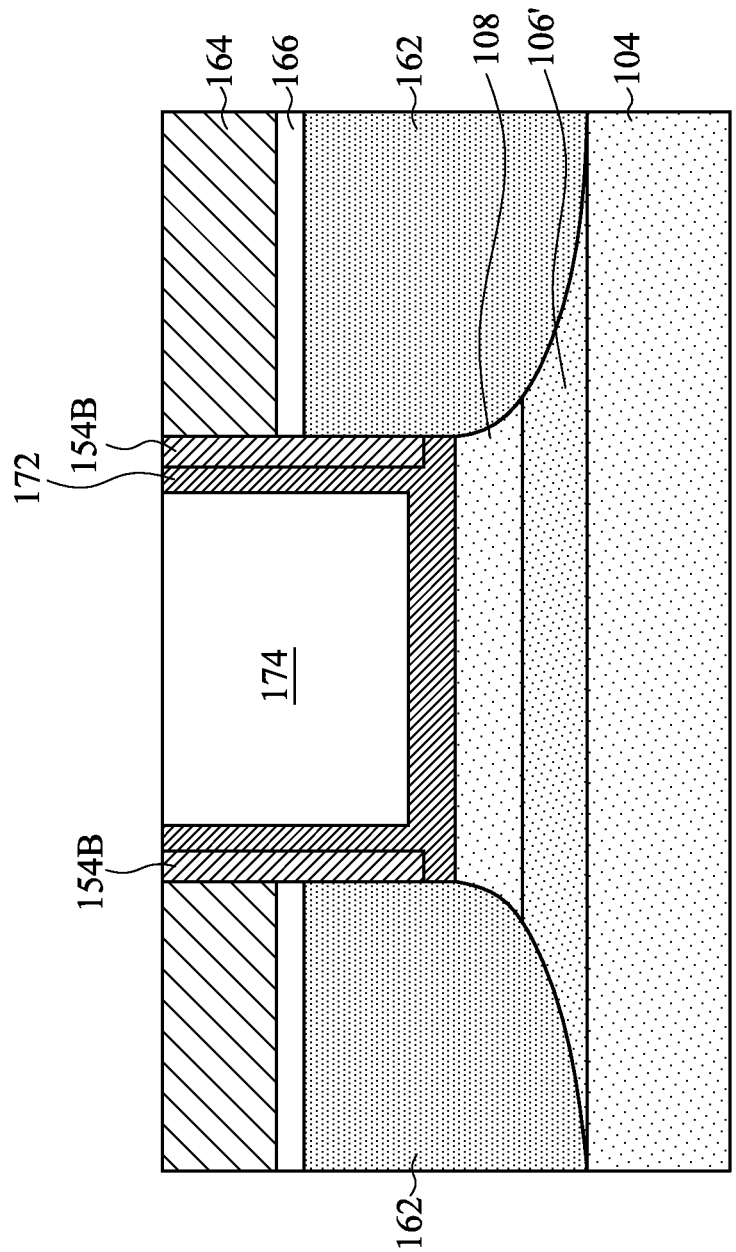
Figure 18:
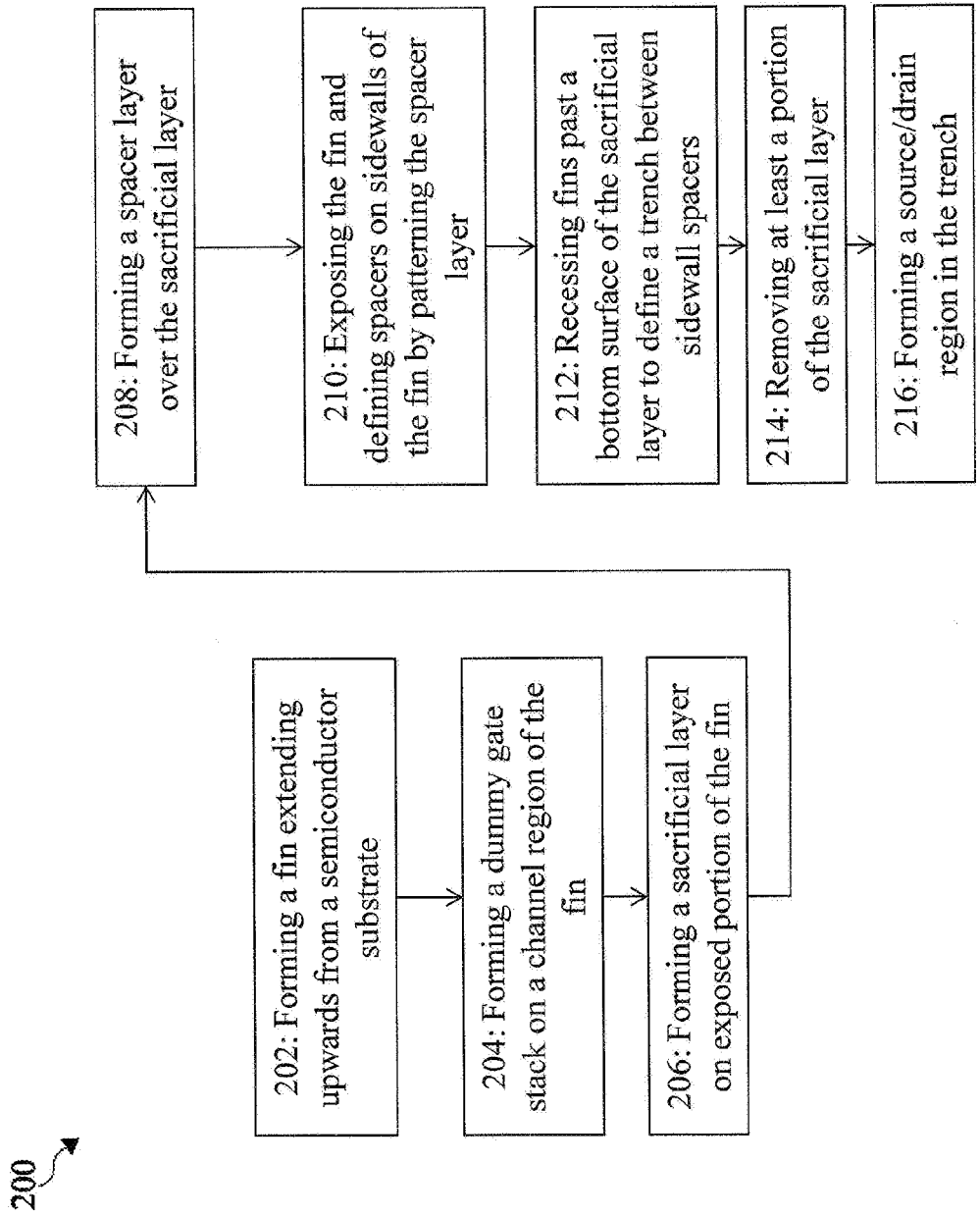
FIG. 18 illustrates a flow diagram of a method for manufacturing a finFET in accordance with some embodiments.

FIGS. 2 through 17C are cross-sectional and three-dimensional views of various intermediary stages in the manufacturing of finFETs in accordance with various embodiments, and FIG. 18 is a process flow of the process shown in FIGS. 2 through 17C. FIGS. 2 through 9 illustrate reference cross-section A-A illustrated in FIG. 1, except for multiple finFETs and/or finFETs having multiple fins. In FIGS. 10A through 17C, figures ending with an "A" designation are illustrated along a similar cross-section A-A; figures ending with a "B" designation are illustrated along a similar cross-section B-B; and figures ending with a "C" designation are illustrated along a similar cross-section C-C. Furthermore, figures ending with a "D" designation are illustrated in a three-dimensional view of the embodiment finFET.

Figure 2:
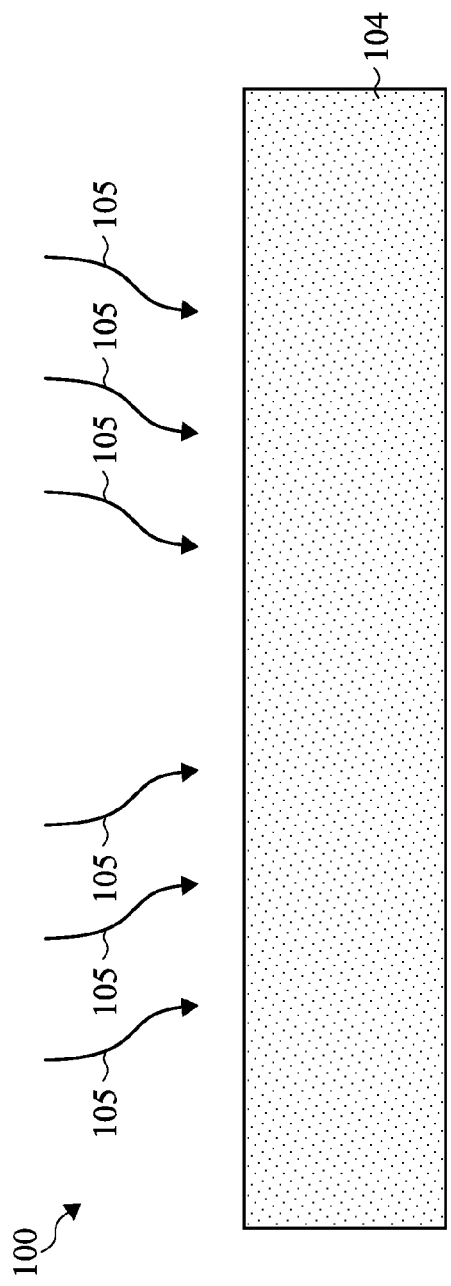
Figure 3:
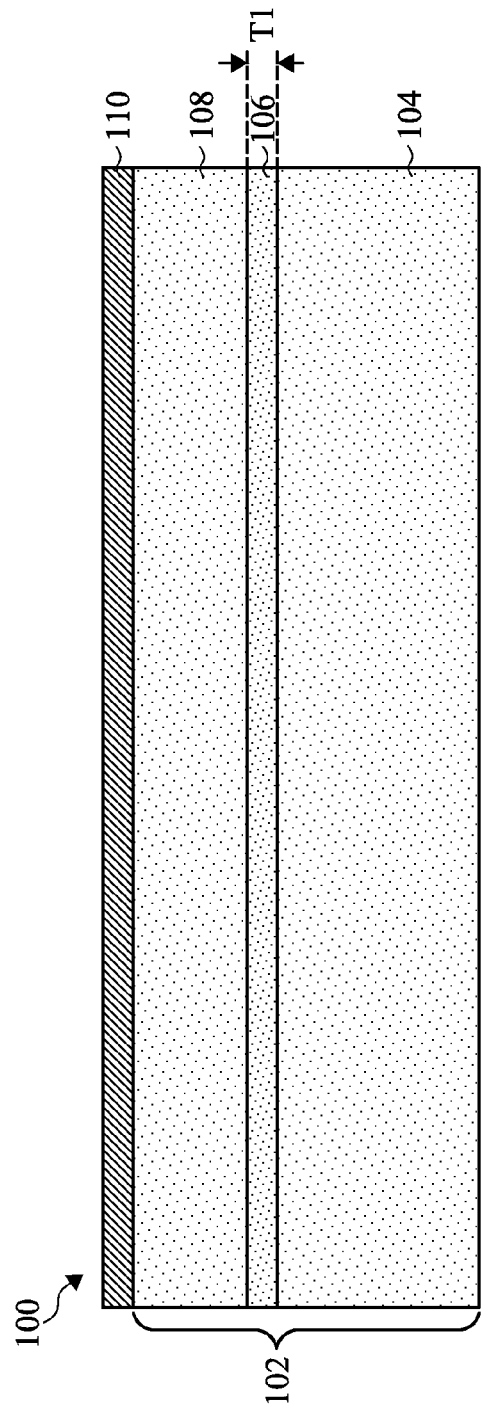

FIGS. 2 through 4 illustrate the formation of semiconductor fins extending upwards from a substrate. Referring first to FIG. 2, a wafer 100 having a base substrate layer 104 is illustrated. Base substrate layer 104 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate layer 104 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As further illustrated by FIG. 2, anti-punch through (APT) dopants may be implanted in the base substrate layer 104 as indicated by arrows 105. In some embodiments, the APT dopants may be implanted to prevent source/drain punch through in the resulting device. The type of APT implanted may depend on whether an n-type or p-type device is desired. For example, for n-type devices, boron may be implanted whereas for p-type devices, phosphorous or arsenic may be implanted. A concentration of APT dopants implanted in base substrate layer 104 may be about $1 \times 10^{18}/cm^3$ to about $3 \times 10^{19}/cm^3$, for example.

Referring next to FIG. 3, additional substrate layers 106/108 may optionally be formed over base substrate layer 104. In some embodiments, epitaxies may be performed to form various substrate layers 106 and 108. Any suitable epitaxy processes may be used, such as by metal-organic (MO) chemical vapor deposition (CVD), molecular beam epitaxy (MBE), liquid phase epitaxy (LPE), vapor phase epitaxy (VPE), selective epitaxial growth (SEG), combinations thereof, or the like.

Substrate layers 106 and 108 are disposed over base substrate layer 104 with substrate layer 108 being disposed over substrate layer 106. In some embodiments substrate layer 106 may comprise SiGe while substrate layer 108 comprises substantially pure Si. In subsequent process steps, substrate layer 106 may be oxidized and a channel region of the device may be formed in substrate layer 108. In such embodiments, substrate layer 106 may act as a barrier layer between an undoped, channel region of substrate layer 108 and the APT dopants implanted in base substrate layer 104. It has been observed that forming an undoped channel on an oxidized SiGe layer, improved mobility and device performance may be achieved. In an embodiment, substrate layer 106 has a thickness T1 of about 5 nm to about 20 nm, for example. Thus, as illustrated by FIG. 2, an embodiment substrate 102 may include multiple layers 104, 106, and 108 of semiconductor material. In other embodiments, substrate layers 106 and 108 may be omitted.

As further illustrated by FIG. 3, hard mask 110 may be disposed over substrate 102. Hard mask 110 may comprise one or more oxide (e.g., silicon oxide) and/or nitride (e.g., silicon nitride) layers to prevent damage to the underlying substrate 102 during patterning. Hard mask 110 may be formed using any suitable deposition process, such as, atomic layer deposition (ALD), chemical vapor deposition (CVD), high density plasma CVD (HDP-CVD), physical vapor deposition (PVD), and the like.

FIG. 4 illustrates the patterning of substrate 102 to form fins 116 disposed between adjacent trenches 114. In an embodiment, a photoresist layer (not shown) may be blanket deposited over hard mask 110. The photoresist may then be patterned by exposing the photoresist to light using a photomask. Exposed or unexposed portions of the photoresist may then be removed depending on whether a positive or negative resist is used. The pattern of the photoresist may then be transferred to hard mask 110 (e.g., using a suitable etching process). Subsequently, trenches 114 are patterned into underlying substrate 102 using hard mask 110 as a patterning mask during an etching process. The etching of substrate 102 may include acceptable etch processes, such as a reactive ion etch (RIE), neutral beam etch (NBE), the like, or a combination thereof. The etching may be anisotropic. Subsequently, the photoresist is removed in an ashing and/or wet strip processes, for example. Thus, fins 116 are formed in wafer 100. Fins 116 extend upwards from a base substrate layer 104 between adjacent trenches 114.

FIG. 5 illustrates an optional oxidation process being applied to wafer 100. In such embodiments, substrate layer 106 may be oxidized to provide a semiconductor oxide layer 106' comprising silicon germanium oxide, for example. Any suitable oxidation process may be used, such as a wet oxidation process that selectively oxidizes the Ge within substrate layer 106 at a higher rate than other semiconductor materials (e.g., bulk Si) of substrate layers 104 or 108. In some example embodiments, the wet oxidation process may include maintaining wafer 100 at a temperature of about 400° C. and about 600° C. while pure water vapor is supplied to wafer 100 in an environment maintained at about 1 Atm of pressure for between about thirty minutes and about one hour. Other suitable oxidation processes may also be used.

The oxidation process may fully oxidize substrate layer 106'. In some embodiments, a residual layer of substantially pure Ge (not separately illustrated) may be formed at top and/or bottom surfaces of substrate layer 106' as a result of the oxidation. In subsequently process steps, a channel region may be formed in a portion of fins 116 over semiconductor oxide layer 106', enhancing mobility and device performance. The oxidation process may further partially oxidize substrate layers 104 and 108, causing the formation of semiconductor oxide regions 108A and 104A comprising SiO, for example. Subsequently, these semiconductor oxide regions 108A and 104A may be removed by a suitable etching process, for example. The etching may also partially etch sidewalls of semiconductor oxide layer 106'. The resulting structure is illustrated in FIG. 6.

Referring next to FIG. 7, trenches 114 may be filled with a dielectric material, such as, silicon oxide, or the like. In some embodiments, the resulting STI regions 126 may be formed using a high-density-plasma (HDP) CVD process, using silane ($SiH_4$) and oxygen ($O_2$) as reacting precursors. In other embodiments, STI regions 126 may be formed using a sub-atmospheric CVD (SACVD) process or high aspect-ratio process (HARP), wherein process gases may comprise tetraethylorthosilicate (TEOS) and ozone ($O_3$). In yet other embodiments, STI regions 126 may be formed using a spin-on-dielectric (SOD) process, such as hydrogen silsesquioxane (HSQ) or methyl silsesquioxane (MSQ). An annealing (or other suitable process) may be performed to cure the material of STI regions 126. Other processes and materials may be used. A chemical mechanical polish (CMP) or other etch back process may be used to level a top surfaces of STI regions 126 and fins 116. Hard mask 110 may also be removed during the CMP/etch back or using another suitable process.

Furthermore, in some embodiments, STI regions 126 may include a conformal liner (not illustrated) formed on sidewalls and a bottom surface of trenches 114 prior to the filling of trenches 114 with a dielectric material. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, atomic layer deposition (ALD), CVD, high density plasma (HDP) CVD, physical vapor deposition (PVD), and the like. In such embodiments, the liner may prevent (or at least reduce) the diffusion of semiconductor material from fins 116 (e.g., Si and/or Ge) into the surrounding STI regions 126 during the annealing of STI regions 126.

Next, in FIG. 8, STI regions 126 are recessed, so that top portions of semiconductor layer 108 are higher than the top surfaces of STI regions 126. The recessing of STI regions 126 may include a chemical etch process, for example, using ammonia ($NH_3$) in combination with hydrofluoric acid (HF) or nitrogen trifluoride ($NF_3$) as reaction solutions either with or without plasma. When HF is used as the reaction solution, a dilution ratio of HF may be between about 1:50 to about 1:100. After recessing, top surfaces and sidewalls of semiconductor layer 108 in fins 116 are be exposed. Channel regions 120 (e.g., exposed portions of semiconductor layer 108 along cross-section A-A) are thus formed in fins 116. In the completed finFET structure, a gate wraps around and covers sidewalls of such channel regions 120 (see e.g., FIGS. 1 and 17A). In some embodiments, channel regions 120 may be disposed on a semiconductor oxide layer 106', and channel regions 120 may be substantially free of any dopants because APT dopants were only implanted in base substrate layer 104. Other configurations of fins 116 and channel regions 120 may be used.

Figure 10A:
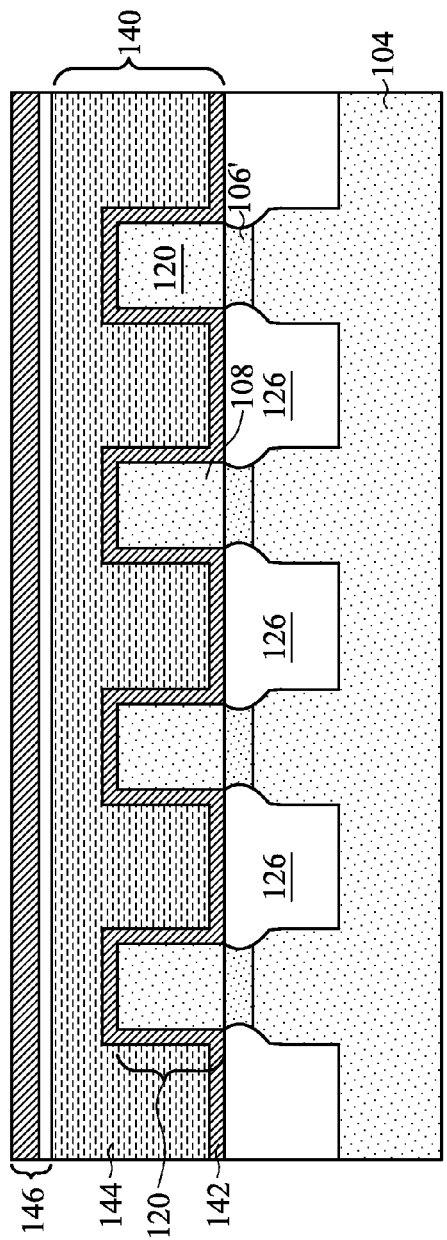
Figure 10B:
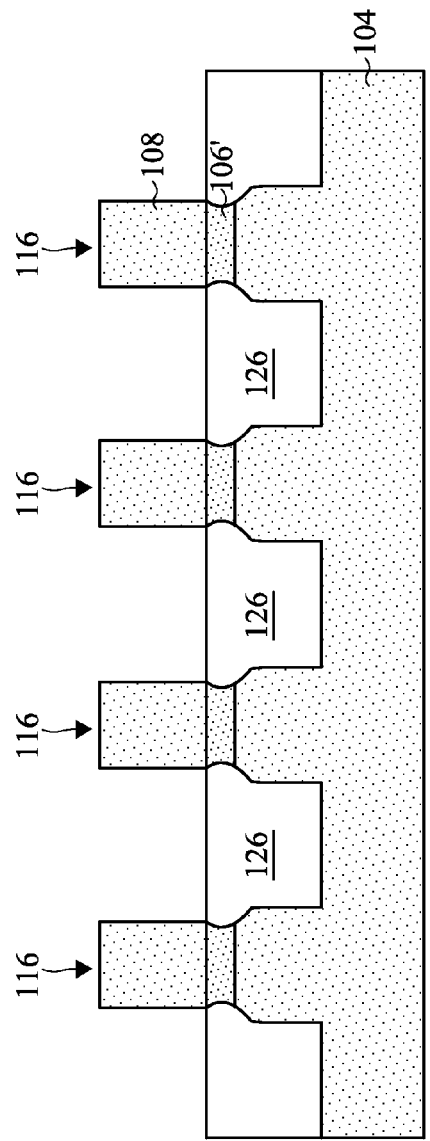

FIG. 9 and FIGS. 10A and 10B illustrate the formation of a gate stack 140 on a top surface and the sidewalls of channel regions 120. As discussed above, FIGS. 9 and 10A illustrate wafer 100 taken across cross-section A-A (e.g., across a channel region of fins 116) while FIG. 10B illustrates wafer 100 taken across cross-section B-B (e.g., across a source/drain region of fins 116). The formation of gate stack 140 begins in FIG. 9 with the deposition of a conformal dummy oxide 142 on a top surface and sidewalls of fins 116. In some embodiments, dummy oxide 142 may be formed over both a channel region 120 and source/drain regions of fins 116.

Next, as illustrated by FIG. 10A, a dummy gate 144 is formed over dummy oxide 142. Dummy gate 144 may comprise, for example, polysilicon, although materials such as metal silicides, metal nitrides, or the like, may also be used. Gate stacks 140 may also have a lengthwise direction substantially perpendicular to the lengthwise direction of semiconductor fins 116 (see e.g., FIG. 1).

A hard mask 146 is then formed over dummy gate 144. Hard mask 146 may include silicon nitride or silicon oxide, for example. In some embodiments, hard mask 146 may be a multilayer comprising, e.g., a nitride layer and an oxide layer. Gate stack 140 may cross over a plurality of semiconductor fins 116 and/or STI regions 126 in some embodiments. Hard mask 146 may be patterned to expose source/drain regions of fins 116 (see e.g., FIG. 10B) while covering channel regions 120. The patterning of hard mask 146 may be done using a combination of photolithography and etching, for example. As further illustrated by FIGS. 10A and 10B, an etching is performed to etch portions of gate stack 140 not covered by hard mask 146. After etching, hard mask 146 and gate stack 140 may remain on channel regions 120 of fins 116 (see FIG. 10A) while source/drain regions of fins 116 are exposed (see FIG. 10B).

Figure 11A:
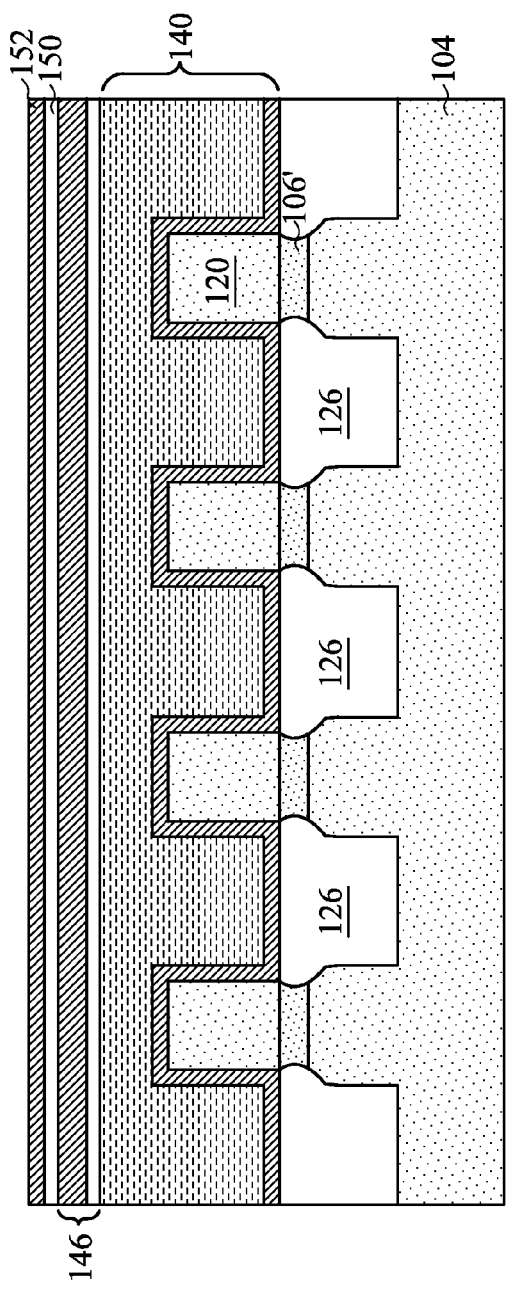
Figure 11B:
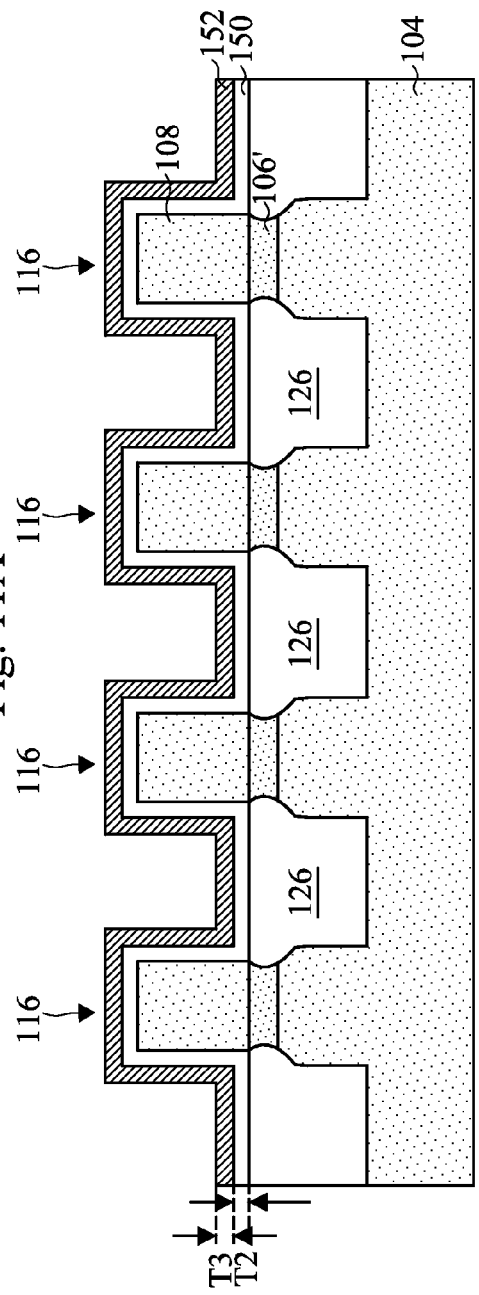
Figure 11C:
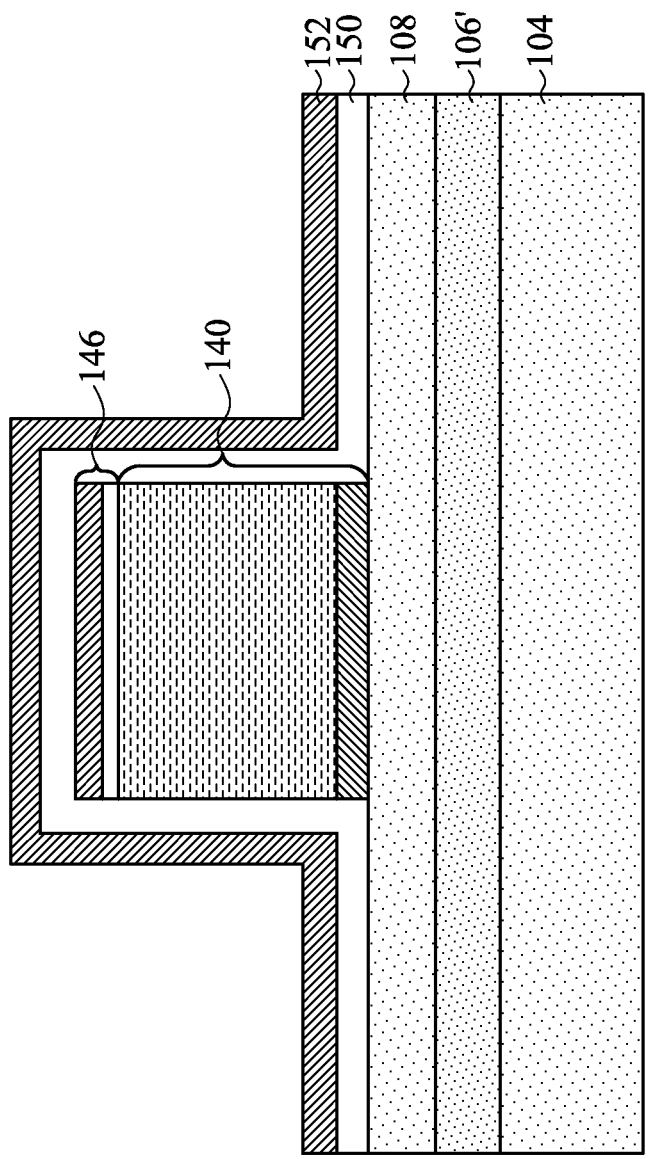
Figure 12A:
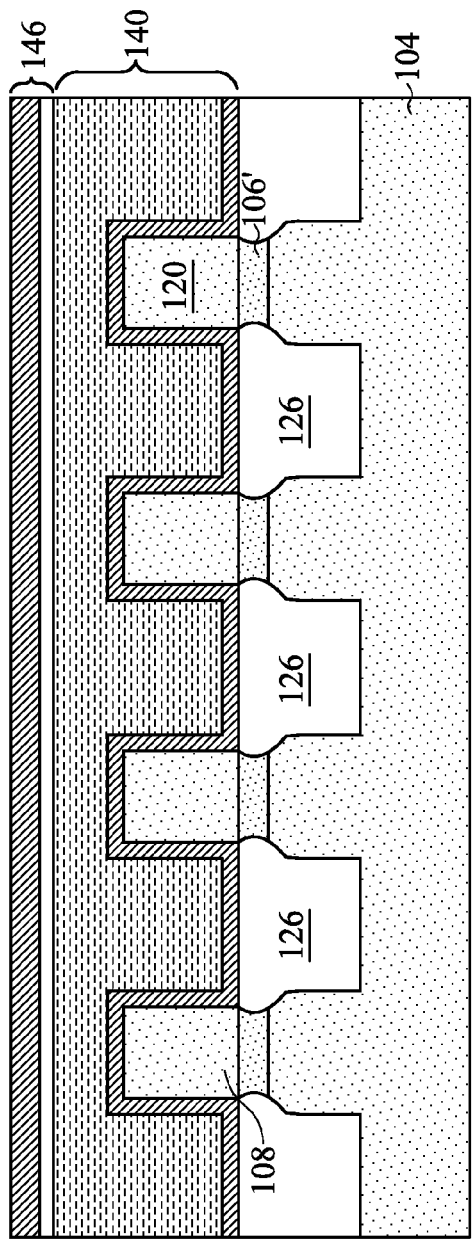
Figure 12B:
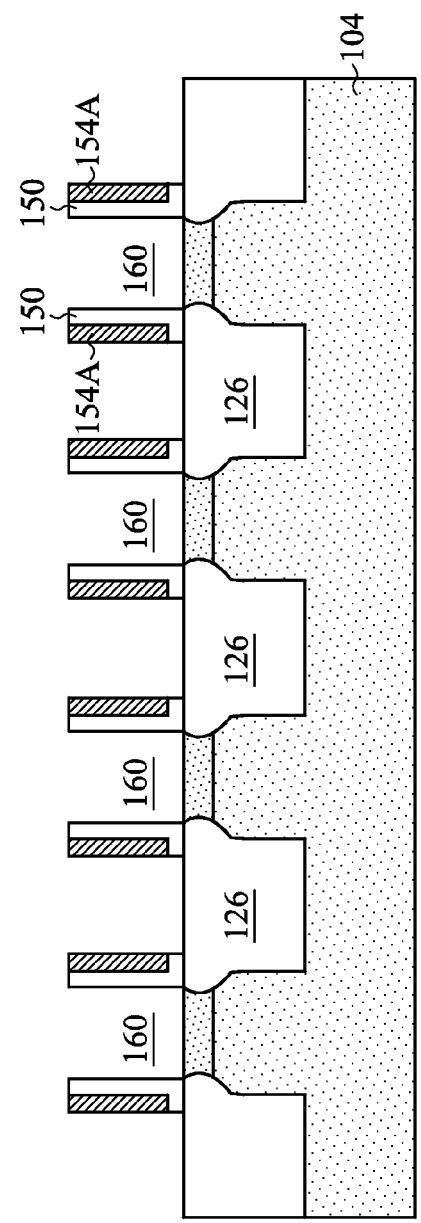
Figure 12C:
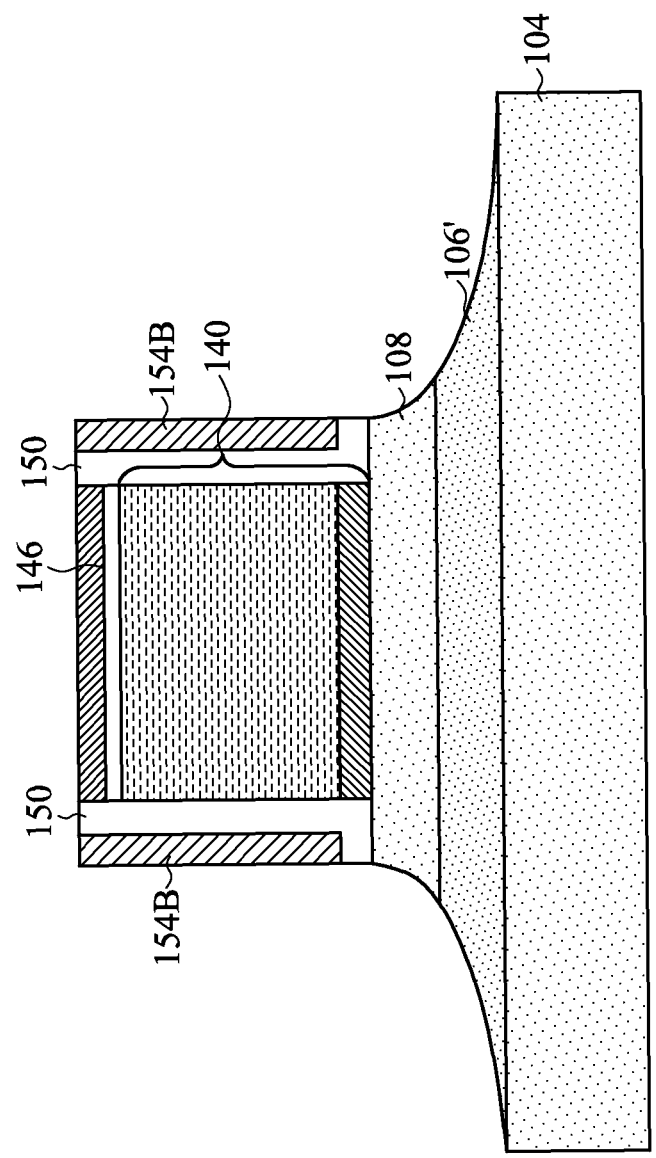
Figure 12D:
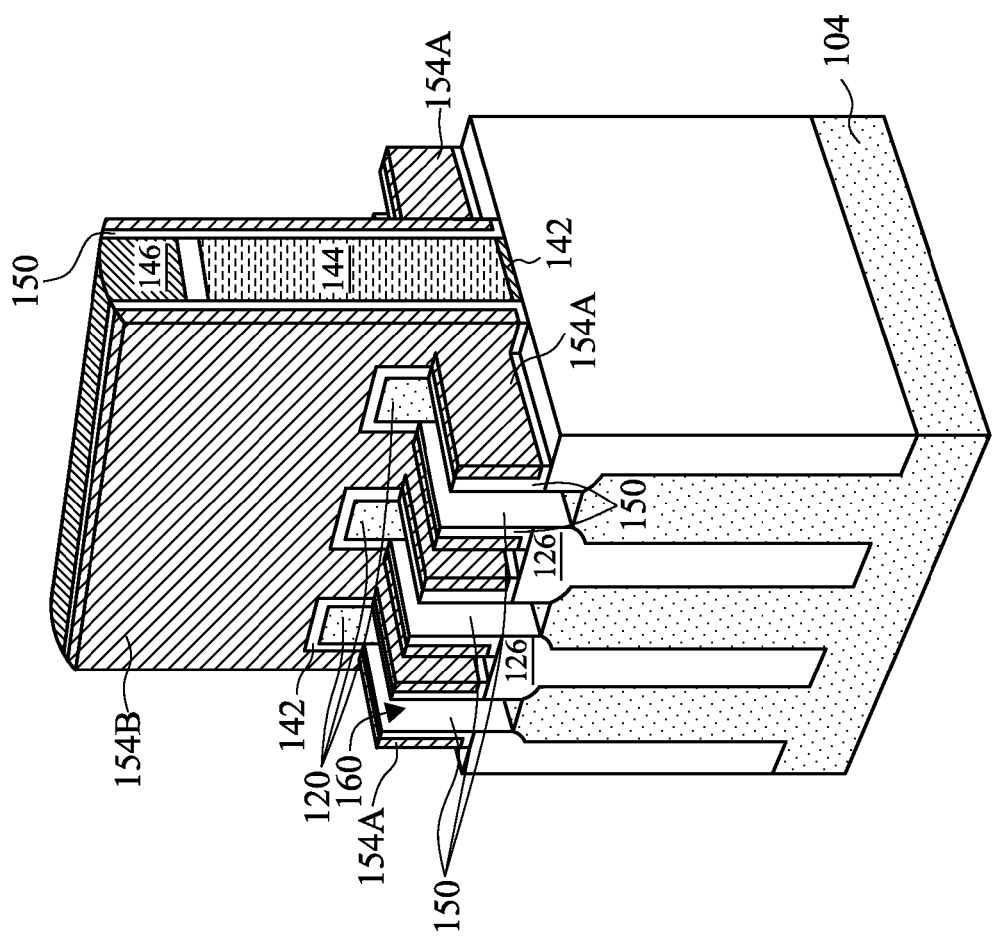

FIGS. 11A through 11C illustrate the formation of a sacrificial layer 150 and spacer layer 152 on fins 116, gate stack 140, and hard mask 146. In various embodiments, the materials of sacrificial layer 150 and spacer layer 152 may be selected so that sacrificial layer 150 can be selectively removed without significantly removing spacer layer 152. For example, in an embodiment spacer layer 152 is an oxide (e.g., SiO) while spacer layer 152 comprises SiOCN. Other dielectric materials, including low-k dielectric materials, may also be used for sacrificial layer 150 and/or spacer layer 152. For example, spacer layer 152 may also comprise a nitride, SiCN, or the like. Sacrificial layer 150 and spacer layer 152 may be conformal layers formed using any suitable method, such as CVD, PECVD, or the like. Spacer layer 152 and sacrificial layer 150 cover a top surface of hard mask 146 (see e.g., FIG. 11A), a top surface and sidewalls of a source/drain portion of fins 116 (see e.g., FIG. 11B), a top surface of isolation layer 126 (see e.g., FIGS. 11B-11C), and sidewalls of gate stack 140 (see e.g., FIG. 11C). Sacrificial layer 150 is disposed on a bottom surface of spacer layer 152 and separates spacer layer 152 from underlying device features (e.g., STI regions 126). In some embodiments, sacrificial layer 150 has a thickness T2 of about 2 nm to about 10 nm, and spacer layer 152 has a thickness T3 of about 3 nm to about 12 nm, for example.

Next, in FIG. 12A through 12D, portions of fins 116 not covered by hard mask 146 (e.g., source/drain regions of fins 116) may be recessed past a top surface of STI regions 126 using an etch back process, for example. As part of the recessing, top portions of spacer layer 152 and sacrificial layer 150 are removed to expose fins 116. Spacer layer 152 and sacrificial layer 150 may further be removed from a top surface of hard mask 146. After fins 116 are exposed, fins 116 are recessed. In some embodiments, the recessing may remove semiconductor oxide layer 106' and expose base substrate layer 104. After etching, top surfaces of exposed portions of fins 116 are lower than sacrificial layer 150 and spacer layer 152. Hard mask 146 prevents the etching of gate structure 140 or channel region 120 of fins 116 during the source/drain etch back.

In the resulting structure, spacers 154 (labeled 154A and 154B) are formed from etched spacer layer 152. In subsequent process steps, spacers 154 may be used as sidewall spacers for defining a gate of the resulting device as well as for defining source/drain epitaxy regions. Trenches 156 are accordingly formed between adjacent source/drain spacers 154A in a source/drain region of the device (see e.g., FIG. 12B). Furthermore, gate stack 140 may be disposed between gate spacers 154B (see e.g., FIG. 12C). Because spacer layer 152 was originally formed as a single conformal layer, spacers 154A may be smoothly connected to spacers 154B with no interface formed therebetween (see e.g., the three dimensional view of FIG. 12D). Sacrificial layer 150 may be disposed under a bottom surface of spacers 154A/154B, and sacrificial layer 150 separates spacers 154A/154B from underlying device layers. Trenches 156 are located on opposite sides of dummy gate stack 140 (see e.g., FIG. 12C).

FIGS. 13A through 13D illustrates the selective removal of portions of sacrificial layer 150 on sidewalls and a bottom surface of source/drain sidewall spacers 154A using any suitable process. For example, in an embodiment a wet etching process using HF as a reaction chemical is used to remove portions of sacrificial layer 150. In such embodiments, a dilution ratio of HF may be about 1:100. In another embodiment, portions of sacrificial layer 150 are removed during an in-situ pre-cleaning process (e.g., a SiCoNi etch to remove a native oxide layer in semiconductor substrate 102) for the epitaxy of source/drain regions in trenches 160 (see e.g., FIGS. 14A through 14D). In such embodiments, a same the epitaxy tool may remove portions of sacrificial layer 150 as well as to grow source/drain regions in trenches 160. The removal of sacrificial layer 150 may be performed at room temperature. In some embodiments, portions of sacrificial layer 150 on sidewalls and a bottom surface of gate spacers 154 may remain (see e.g., FIGS. 13C and 13D). In such embodiments, portions of sacrificial layer 150 that remain are protected by spacers 154B during the removal (e.g., etching) of the portions of sacrificial layer 150 on sidewalls and a bottom surface of source/drain sidewall spacers 154A.

Figure 13C:
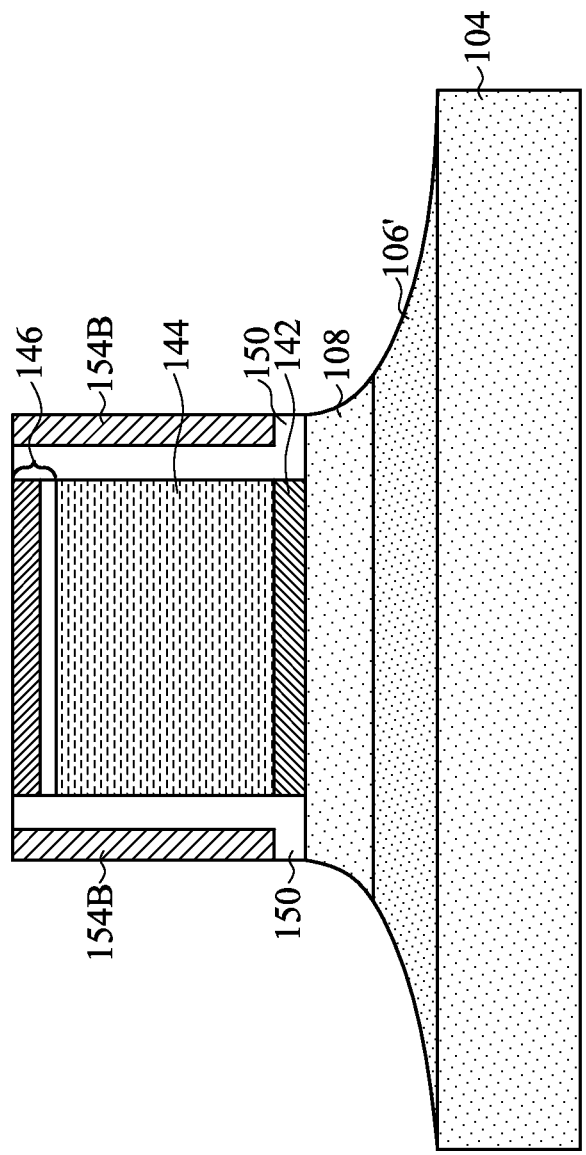
Figure 13D:
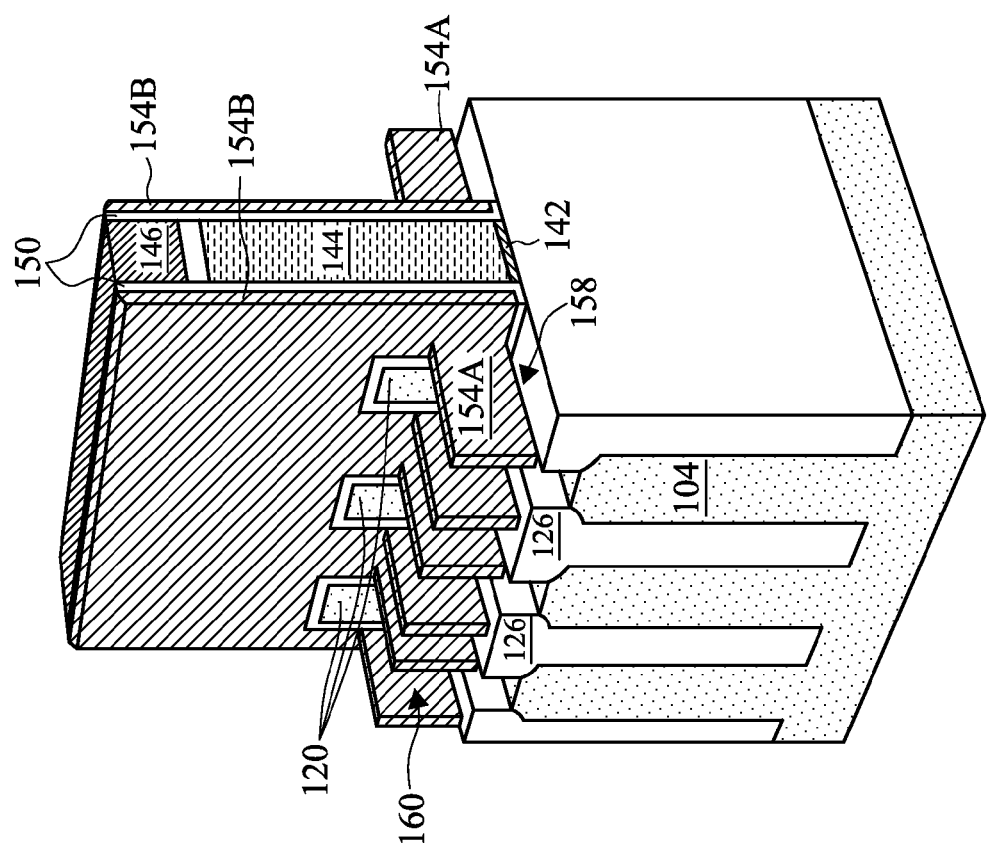

Spacers 154A are connected to and structurally supported by gate spacers 154B (see e.g., FIG. 13D). Therefore, the removal of sacrificial layer 150 forms openings 158 between spacers 154A and underlying device features, such as, STI regions 126 (see e.g., FIGS. 13B and 13D). Openings 158 are connected to trenches 160. During epitaxy, openings 158 allow for precursors to flow under spacers 154A and grow source/drain regions in trenches 160.

In FIGS. 14A through 14D, epitaxy regions 162 are formed by selectively growing a semiconductor material in trenches 160. In some embodiments, epitaxy regions 162 include silicon, germanium (with no silicon), silicon germanium, silicon phosphorous, silicon germanium boron, or the like. Hard mask 146 and spacers 152B may mask areas of wafer 100 to define an area for forming epitaxy regions 160 on substrate layer 104 (e.g., only on exposed portions of fins 116). During epitaxy, openings 158 (see FIGS. 13B and 13D) may allow precursors to flow directly into a bottom of trenches 160. Thus, trenches 160 may be filled with precursor from multiple directions (e.g., from both top and bottom regions), reducing the formation of voids in epitaxy regions 162. In some embodiments, the type of precursor used depends on whether an NMOS or PMOS device is formed. For example, for NMOS devices, gaseous silicon, phosphorous, or a combination thereof may be used while for PMOS devices, gaseous silicon, germanium, boron, or a combination thereof may be used.

After trenches 160 are filled with epitaxy regions 162, the further epitaxial growth of source/drain regions causes epitaxy regions 162 to expand horizontally, and facets may start to form. After the epitaxy step, epitaxy regions 162 may be implanted with p-type impurities (e.g., boron or $BF_2$) in PMOS devices or n-type impurities (e.g., phosphorous or arsenic) in NMOS devices to form source/drain regions, which are also denoted using reference numeral 162. Alternatively, the p-type or n-type impurity may be in-situ doped when epitaxy regions 162 are grown to form source/drain regions.

Figure 14C:
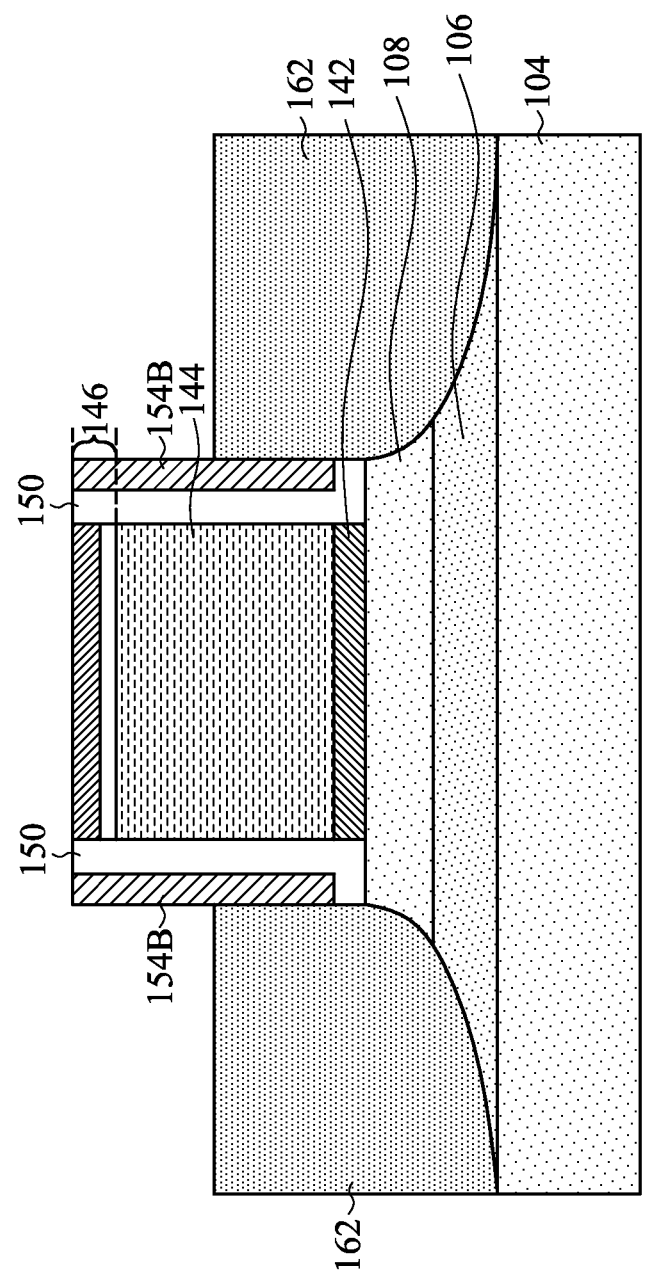
Figure 14D:
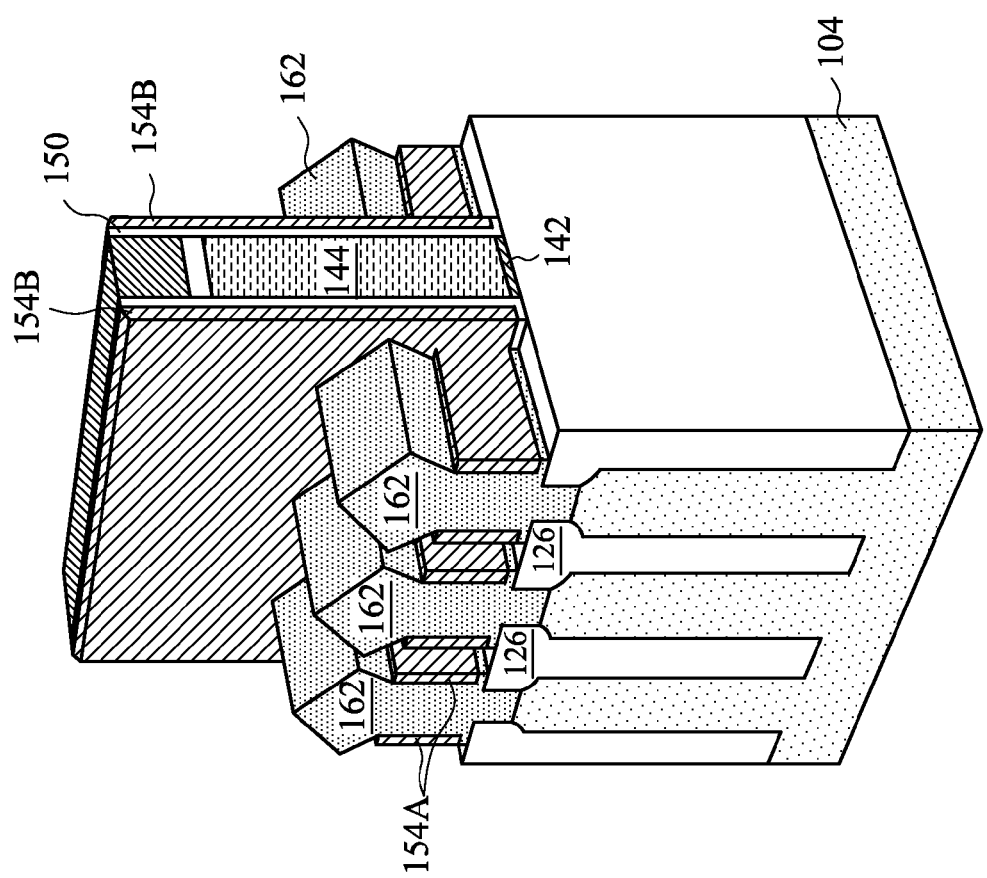

In the resulting device source/drain regions 162 are on the opposite sides of gate stack 140 and further extend upwards along sidewalls of gate stack 140 (see FIGS. 14C and 14D). Furthermore, because the epitaxy is performed through openings 158, at least a portion of source/drain regions 162 and may be disposed under source/drain sidewall spacers 154A (see e.g., FIG. 14B). These portions of source/drain regions 162 may be disposed between source/drain sidewall spacers 154A and underlying STI regions 126. In some embodiments, source/drain regions 162 have a height H1 of about 30 nm to about 80 nm, and source/drain regions 162 have a width W1 of about 8 nm to about 16 nm between spacers 154A. In some embodiments, portions of source/drain regions 162 between spacer 154A and STI regions 126 may have a thickness T4 of about 2 nm to about 10 nm.

FIGS. 14E and 14D illustrates cross sectional views of source/drain regions 162 according to other embodiments. FIGS. 14E and 14D illustrate may be taken across cross section B-B of FIG. 1. In an embodiment illustrated by FIG. 14E, the epitaxy process may merge bottom portions of source/drain regions 162. For example, portions of source/drain region 162 under spacers 154A may extend laterally and merge. These merged regions 162A may be disposed on and cover STI regions 126. In an embodiment illustrated by FIG. 14F, the epitaxy process may further grow merged regions 162A upwards along sidewalls of spacers 154A over STI regions 126. In such embodiments, height H2 of merged regions 162A may be less than about half of height H3 of spacers 154A. In some embodiments, height H2 may be less than about a third of height H3.

Figure 15C:
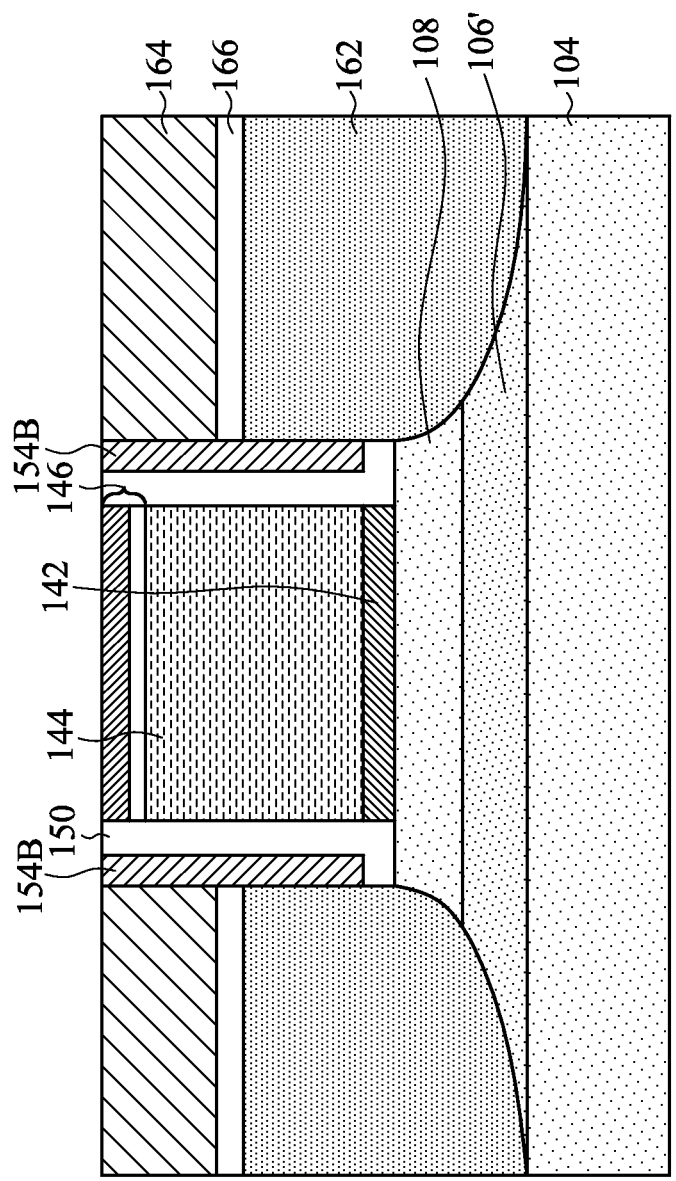

FIGS. 15A through 15C illustrate wafer 100 after interlayer dielectric 164 is formed. ILD 164 may comprise flowable oxide formed using, for example, flowable chemical vapor deposition (FCVD). A CMP (or other suitable planarization process) may be performed to level the top surfaces of ILD 164, gate stack 140, and gate spacers 154B with each other. Various intermediary layers 166 (e.g., buffer layers and/or etch stop layers) may be disposed between ILD layer 164 and source/drain regions 162, gate stack 140, and/or gate spacers 154B.

Figure 16A:
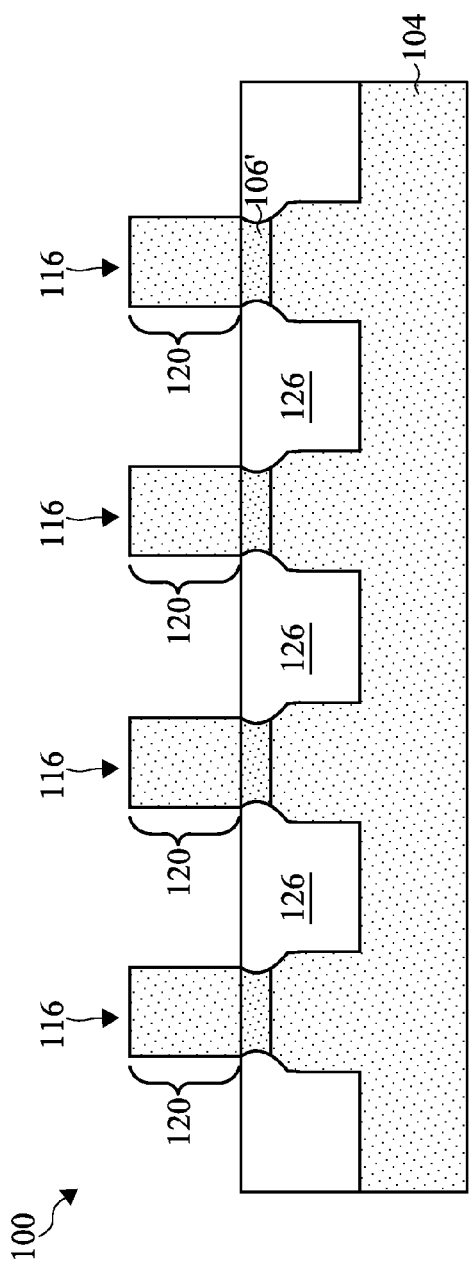
Figure 16B:
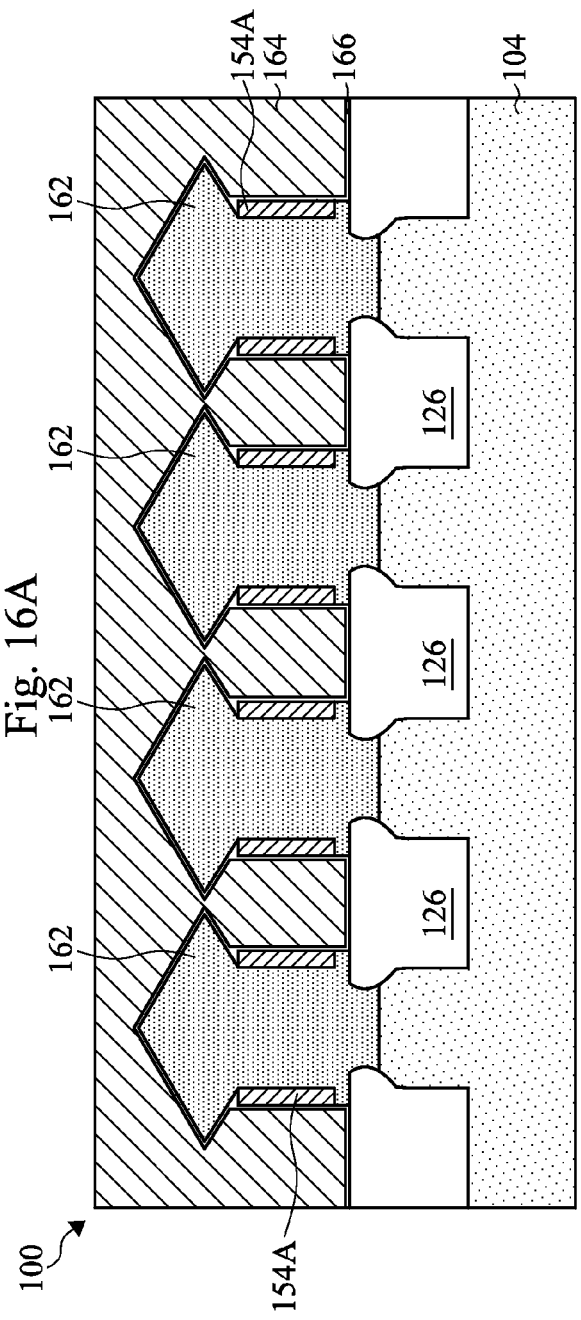
Figure 16C:
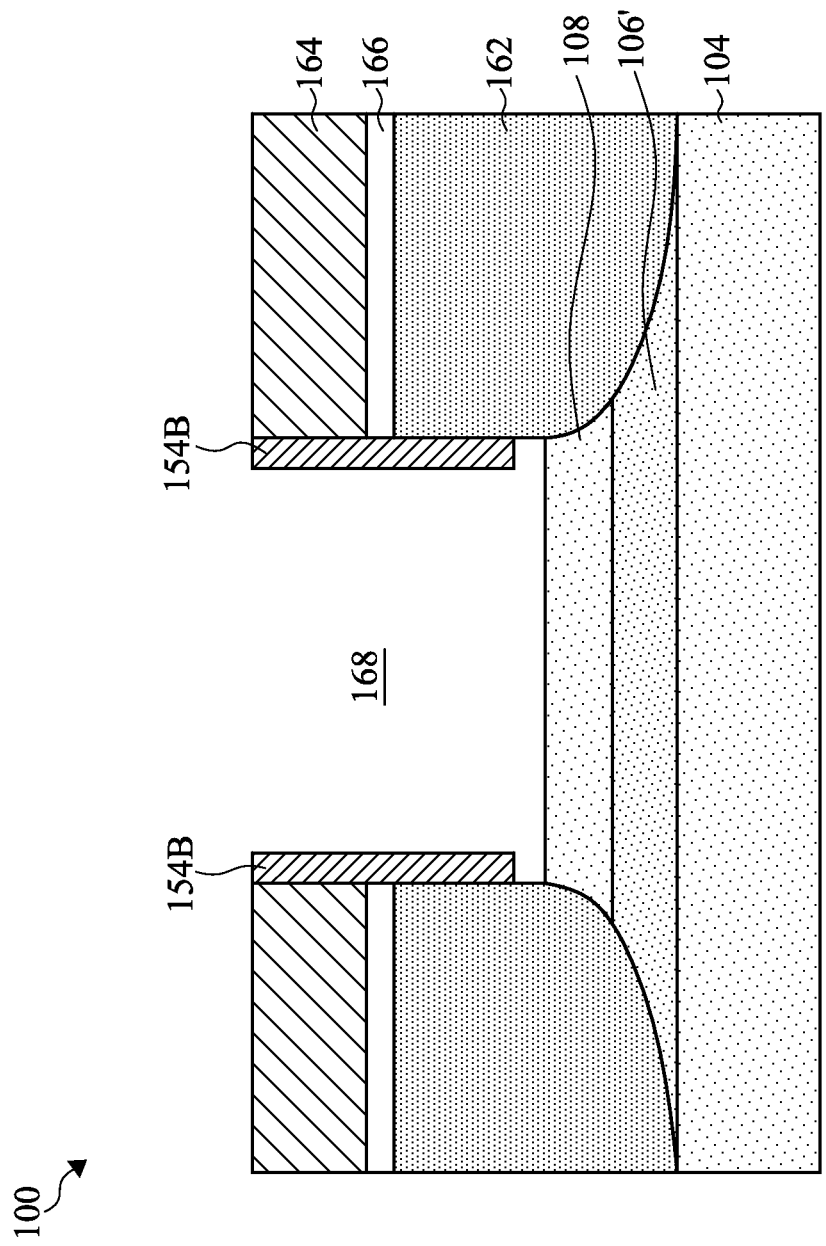

FIGS. 16A through 16C illustrate varying views of wafer 100 after exposing channel regions 120 of fins 116. Exposing channel regions 120 may include removing gate stack 140 (including hard mask 146, dummy gate 144, and dummy oxide 142) from sidewalls and top surfaces of channel regions 120 using an etching process, for example. The removal of gate stack 140 may define trench 168 between gate spacers 154B (see FIG. 16C). A hard mask (not shown) may be used to mask ILD 164 and source/drain regions 162 during the removal of gate stack 140. Thus, gate stack 140 may be removed without patterning ILD 164 or source/drain regions 162. Remaining portions of sacrificial layer (e.g., portions disposed on sidewalls and under gate spacers 154B) may also be removed.

Next, referring to FIGS. 17A through 17B, a gate stack 170 is formed in trenches 168. For example, a gate dielectric 172 is formed as a conformal layer in trenches 168. Gate dielectric 172 may further be formed under gate spacers 154B (see e.g., FIG. 17C) Gate dielectric 172 may cover top surfaces and the sidewalls of channel regions 120 (see FIG. 17A). In accordance with some embodiments, gate dielectric 172 includes silicon oxide, silicon nitride, or multilayers thereof. In alternative embodiments, gate dielectric 172 includes a high-k dielectric material. In such embodiments, gate dielectric 172 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of gate dielectric 172 may include molecular beam deposition (MBD), ALD, plasma enhanced CVD (PECVD), or the like.

Next, a conductive gate electrode 174 is formed over gate dielectric 172 by filling remaining portions of trench 168 with a conductive material. Gate electrode 174 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. The formation of gate dielectric 172 and gate electrode 174 may overflow trench 160 and cover a top surface of ILD 164. Subsequently, a planarization (e.g., a CMP) is performed to remove the excess portions of gate dielectric 172 and gate electrode 174. The resulting remaining portions of gate dielectric 172 and gate electrode 174 form a gate stack 170 over channel regions 120 of the resulting finFETs. In an embodiment, channel regions 120 have a width W2 of about 6 nm to about 12 nm and a height H4 of about 30 nm to about 80 nm, for example. Additional features, such as source/drain contacts (not illustrated), for example, comprising nickel (Ni), tungsten (W), or the like may then be formed in ILD 164 using any suitable process to electrically connect with source/drain regions 162.

FIG. 18 illustrates an example process flow 200 for forming semiconductor devices (e.g., finFETs) in accordance with some embodiments. Process 200 begins with forming a fin (e.g., fins 116) extending upwards from a semiconductor substrate (e.g., substrate 102) in step 202. In step 204, a dummy gate stack (e.g., gate stack 140) is formed over a top surface and sidewalls of a channel region (e.g., channel region 120) of the fin. In step 206, a sacrificial layer (e.g., sacrificial layer 150) is formed on an exposed portion of the fin. The sacrificial layer may further be formed over a top surface and on sidewalls of the dummy gate stack.

The process continues in step 208 with a spacer layer (e.g., spacer layer 152) being formed over the sacrificial layer. The spacer layer may be disposed on sidewalls of the sacrificial layer, and a portion of the sacrificial layer may extend under a bottom surface of the spacer layer. In step 210, the fin is exposed by removing top portions of the spacer layer and the sacrificial layer. Removing the top portions of the spacer layer further defines sidewall spacers (e.g., spacers 154A) on sidewalls of the portion of the fin and gate spacers (e.g., spacers 154B) on sidewalls of the dummy gate stack.

Next, in step 212, a trench (e.g., trench 160) is defined between the sidewall spacers by recessing the fin past a bottom surface of the sacrificial layer. In step 214, at least a portion of the sacrificial layer is removed. The sidewall spacers are connected to and structurally supported by the gate spacer, and removing the portion of the sacrificial layer defines openings (e.g., openings 158) under the sidewall spacer. The openings may be connected to the trench. In step 216, a source/drain region (e.g., source/drain region 162) is epitaxially grown in the trench. The epitaxy of the source/drain region may include flowing a precursor into the trench between the sidewall spacers as well as through the openings. Thus, epitaxial growth can be triggered from multiple directions, reducing voids in the resulting source/drain region.

Various embodiments include the formation of a sacrificial layer and a spacer layer on a fin for improved source/drain epitaxy. The sacrificial layer may be formed on a fin prior to the formation of the spacer layer. Notably, the sacrificial layer may be disposed between a bottom of the sidewall spacer and the underlying device features (e.g., STI regions disposed adjacent fins). The removal of the sacrificial layer may form an opening under the spacer layer (e.g., between the spacer layer and the underlying STI regions). Portions of the fin between the sidewall spacers are recessed, and at least a portion of the sacrificial layer is removed. An epitaxial process may be performed to grow source/drain regions between the sidewall spacers. During epitaxy, a precursor may flow from both a top area and a bottom area (e.g., through the openings) of adjacent sidewall spacers. Thus, source/drain regions may be grown multi-directionally between sidewall spacers, which advantageously decreases the risk of forming voids even in relatively high aspect ratio fins.

In accordance with an embodiment, a semiconductor device includes a fin extending upwards from a semiconductor substrate and a gate stack disposed on a top surface and sidewalls of the fin. The device further includes a first source/drain region over the semiconductor substrate and adjacent the gate stack and a first source/drain spacer on a sidewall of the first source/drain region. A portion of the first source/drain region extends under a bottom surface of the first source/drain spacer.

In accordance with another embodiment, a method for forming a semiconductor device includes forming a fin extending upwards from a semiconductor substrate and forming a sacrificial layer on sidewalls of a portion of the fin. The method further includes forming a spacer layer over the sacrificial layer and recessing the portion of the fin past a bottom surface of the sacrificial layer. The recessing forms a trench disposed between sidewall portions of the spacer layer. At least a portion of the sacrificial layer is removed, and a source/drain region is formed in the trench In accordance with yet another embodiment, a method for forming a semiconductor device, the method includes forming a semiconductor fin and forming a plurality of sidewall spacers. The semiconductor fin is disposed between adjacent ones of the plurality of sidewall spacers. Openings are formed under a bottom surface of the plurality of sidewall spacers and a first trench is formed between the first adjacent ones of the plurality of sidewall spacers. The method further includes epitaxially growing a first source/drain region in the first trench over the first semiconductor fin, wherein epitaxially growing the first source/drain region comprises flowing a precursor into the first trench through the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
forming a fin extending upwards from a semiconductor substrate;
forming a sacrificial layer on sidewalls of a portion of the fin;
forming a spacer layer over the sacrificial layer;

recessing the portion of the fin past a bottom surface of the sacrificial layer, wherein the recessing forms a trench disposed between sidewall portions of the spacer layer;

removing at least a portion of the sacrificial layer under the spacer layer; and forming a source/drain region in the trench.

2. The method of claim 1, wherein forming the source/drain region in the trench comprises an epitaxially growing the source/drain region.

3. The method of claim 2, wherein removing at least the portion of the sacrificial layer defines openings under the spacer layer, and wherein epitaxially growing the source/drain region comprises flowing a precursor through the openings into the trench.

4. The method of claim 3, wherein the fin is disposed adjacent a shallow trench isolation (STI) region, wherein removing at least the portion of the sacrificial layer forms the openings between a bottom surface of the spacer layer and the STI region.

5. The method of claim 1 further comprising forming a gate stack over sidewalls and a top surface of a channel region of the fin, wherein forming the sacrificial layer and the spacer layer comprises forming the sacrificial layer and the spacer layer on sidewalls of the gate stack.

6. The method of claim 1 wherein forming the sacrificial layer comprises depositing the sacrificial layer on a top surface and sidewalls of the portion of the fin, wherein forming the spacer layer comprises depositing the spacer layer on a top surface and sidewalls of the sacrificial layer, and wherein recessing the portion of the fin comprises exposing the portion of the fin by removing top portions of the sacrificial layer and the spacer layer.

7. A method for forming a semiconductor device, the method comprising:

forming a first semiconductor fin;

forming a plurality of sidewall spacers, wherein the first semiconductor fin is disposed between first adjacent ones of the plurality of sidewall spacers;

forming openings under a bottom surface of the plurality of sidewall spacers;

forming a first trench between the first adjacent ones of the plurality of sidewall spacers; and epitaxially growing a first source/drain region in the first trench over the first semiconductor fin, wherein epitaxially growing the first source/drain region comprises flowing a precursor into the first trench through the openings.

8. The method of claim 7, wherein forming openings under a bottom surface of the plurality of sidewall spacers comprises:

forming a sacrificial layer between the plurality of sidewall spacers and the first semiconductor fin, wherein the sacrificial layer extends under the bottom surface of the plurality of sidewall spacers; and removing at least a portion of the sacrificial layer.

9. The method of claim 7, wherein epitaxially growing the first source/drain regions further comprises flowing the precursor into the first trench between the first adjacent ones of the plurality of sidewall spacers.

10. The method of claim 7 further comprising:

forming a second semiconductor fin, wherein the second semiconductor fin is disposed between second adjacent ones of the plurality of sidewall spacers;

defining a second trench the second adjacent ones of the plurality of sidewall spacers;

epitaxially growing a second source/drain region in the second trench over the second semiconductor fin, wherein epitaxially growing the second source/drain region comprises:

flowing a precursor into the second trench through the openings; and forming an epitaxy region connecting the first and the second source/drain regions.

11. The method of claim 10, wherein the epitaxy region extends upwards along sidewalls of the plurality of sidewall spacers.

12. The method of claim 7, wherein forming the first trench comprises recessing the first semiconductor fin past a top surface of a shallow trench isolation (STI) region.

13. The method of claim 7, further comprising:

forming a gate stack on a top surface and a sidewalls of a portion of the first semiconductor fin; and forming gate spacers on sidewalls of the gate stack, wherein the plurality of sidewall spacers are connected to and structurally supported by the gate spacers while forming openings under the bottom surface of the plurality of sidewall spacers.

14. A method comprising:

forming a fin extending upwards from a semiconductor substrate, wherein the fin is disposed adjacent to and extends above a shallow trench isolation (STI) region;

depositing a sacrificial layer over a top surface and along sidewalls of a first portion of the fin, wherein the sacrificial layer is further deposited over a top surface of the STI region;

depositing a spacer layer over the sacrificial layer, over the top surface of the first portion of the fin, over the top surface of the STI region, and along the sidewalls of the first portion of the fin;

removing lateral portions of the sacrificial layer and the spacer layer to expose the first portion of the fin and the top surface of the STI region, wherein removing lateral portions of the spacer layer defines sidewall spacers along opposing sides of the first portion of the fin;

removing the first portion of the fin to define a trench between the sidewall spacers;

removing remaining portions of the sacrificial layer to define an opening between a first one of the sidewall spacers and the STI region; and epitaxially growing semiconductor material in the trench.

15. The method of claim 14, wherein epitaxially growing the semiconductor material comprises flowing a precursor chemical into the trench through the opening.

16. The method of claim 14 further comprising:

forming a gate stack on a top surface and a sidewalls of a second portion of the fin; and forming gate spacers on sidewalls of the gate stack, wherein the sidewall spacers are connected to and structurally supported by the gate spacers while removing the remaining portions of the sacrificial layer.

17. The method of claim 16, wherein the gate stack masks the second portion of the fine while removing the first portion of the fin.

18. The method of claim 14, wherein epitaxially growing the semiconductor material comprises epitaxially growing the semiconductor material between the sidewall spacer and the STI region.

19. The method of claim 14, wherein epitaxially growing the semiconductor material comprises epitaxially growing the semiconductor material along opposing sidewalls of the first one of the sidewall spacers.

20. The method of claim 14, wherein epitaxially growing the semiconductor material comprises epitaxially growing the semiconductor material to cover an entire top surface of the STI region.

* * * * *